United States Patent
Pendse

(10) Patent No.: US 9,847,309 B2
(45) Date of Patent: Dec. 19, 2017

(54) SEMICONDUCTOR DEVICE AND METHOD OF FORMING VERTICAL INTERCONNECT STRUCTURE BETWEEN SEMICONDUCTOR DIE AND SUBSTRATE

(75) Inventor: Rajendra D. Pendse, Fremont, CA (US)

(73) Assignee: STATS ChipPAC Pte. Ltd., Singapore (SG)

( * ) Notice: Subject to any disclaimer, the term of this patent is extended or adjusted under 35 U.S.C. 154(b) by 679 days.

(21) Appl. No.: 13/476,410

(22) Filed: May 21, 2012

(65) Prior Publication Data

US 2012/0223428 A1 Sep. 6, 2012

Related U.S. Application Data

(63) Continuation-in-part of application No. 12/731,354, filed on Mar. 25, 2010, now Pat. No. 8,193,035,
(Continued)

(51) Int. Cl.
*H01L 21/28* (2006.01)
*H01L 23/00* (2006.01)
(Continued)

(52) U.S. Cl.
CPC .......... *H01L 24/16* (2013.01); *H01L 21/4853* (2013.01); *H01L 23/49811* (2013.01);
(Continued)

(58) Field of Classification Search
CPC ............ H01L 23/49838; H05K 3/4007; B23K 35/025
See application file for complete search history.

(56) References Cited

U.S. PATENT DOCUMENTS 5,378,859 A   1/1995   Shirasaki et al.
5,386,624 A   2/1995   George et al.
(Continued)

FOREIGN PATENT DOCUMENTS

JP   64-037038   7/1989
JP   04-355933   9/1992
(Continued)

OTHER PUBLICATIONS

FlipChip International, "Bumping Design Guide," Rev. Aug. 2005, http://www.flipchip.com.
(Continued)

*Primary Examiner* — Thomas L Dickey
(74) *Attorney, Agent, or Firm* — Robert D. Atkins; Patent Law Group: Atkins and Associates; P.C.

(57) ABSTRACT

A semiconductor device has a semiconductor die and substrate with a plurality of stud bumps formed over the semiconductor die or substrate. The stud bumps include a base portion and stem portion extending from the base portion. The stud bumps include a non-fusible material or fusible material. The semiconductor die is mounted to the substrate with the stud bumps electrically connecting the semiconductor die to the substrate. A width of the base portion is greater than a mating conductive trace formed on the substrate. Alternatively, a vertical interconnect structure, such as a conductive column, is formed over the semiconductor die or substrate. The conductive column can have a tapered sidewall or oval cross sectional area. An underfill material is deposited between the semiconductor die and substrate. The semiconductor die includes a flexible property. The vertical interconnect structure includes a flexible property. The substrate includes a flexible property.

7 Claims, 26 Drawing Sheets

Related U.S. Application Data which is a continuation of application No. 11/525,493, filed on Sep. 22, 2006, now Pat. No. 7,713,782.

(51) Int. Cl.
    *H01L 23/498* (2006.01)
    *H01L 21/48* (2006.01)
    *H01L 21/56* (2006.01)
    *H01L 23/31* (2006.01)
    *H01L 27/146* (2006.01)

(52) U.S. Cl.
    CPC .............. *H01L 24/13* (2013.01); *H01L 24/81* (2013.01); *H01L 24/97* (2013.01); *H01L 21/568* (2013.01); *H01L 23/3121* (2013.01); *H01L 24/03* (2013.01); *H01L 24/05* (2013.01); *H01L 24/11* (2013.01); *H01L 27/14618* (2013.01); *H01L 2224/0401* (2013.01); *H01L 2224/05082* (2013.01); *H01L 2224/05624* (2013.01); *H01L 2224/1134* (2013.01); *H01L 2224/1184* (2013.01); *H01L 2224/1312* (2013.01); *H01L 2224/13013* (2013.01); *H01L 2224/13014* (2013.01); *H01L 2224/13017* (2013.01); *H01L 2224/13076* (2013.01); *H01L 2224/13082* (2013.01); *H01L 2224/13111* (2013.01); *H01L 2224/13113* (2013.01); *H01L 2224/13116* (2013.01); *H01L 2224/13124* (2013.01); *H01L 2224/13139* (2013.01); *H01L 2224/13144* (2013.01); *H01L 2224/13147* (2013.01); *H01L 2224/13155* (2013.01); *H01L 2224/1601* (2013.01); *H01L 2224/16225* (2013.01); *H01L 2224/16227* (2013.01); *H01L 2224/16245* (2013.01); *H01L 2224/32225* (2013.01); *H01L 2224/45144* (2013.01); *H01L 2224/45147* (2013.01); *H01L 2224/48624* (2013.01); *H01L 2224/48824* (2013.01); *H01L 2224/73204* (2013.01); *H01L 2224/73265* (2013.01); *H01L 2224/81191* (2013.01); *H01L 2224/81192* (2013.01); *H01L 2224/81193* (2013.01); *H01L 2224/81815* (2013.01); *H01L 2224/97* (2013.01); *H01L 2924/00013* (2013.01); *H01L 2924/014* (2013.01); *H01L 2924/01004* (2013.01); *H01L 2924/0105* (2013.01); *H01L 2924/01005* (2013.01); *H01L 2924/01006* (2013.01); *H01L 2924/01013* (2013.01); *H01L 2924/01014* (2013.01); *H01L 2924/01022* (2013.01); *H01L 2924/01023* (2013.01); *H01L 2924/01024* (2013.01); *H01L 2924/01028* (2013.01); *H01L 2924/01029* (2013.01); *H01L 2924/01047* (2013.01); *H01L 2924/01049* (2013.01); *H01L 2924/01051* (2013.01); *H01L 2924/01061* (2013.01); *H01L 2924/01074* (2013.01); *H01L 2924/01075* (2013.01); *H01L 2924/01078* (2013.01); *H01L 2924/01079* (2013.01); *H01L 2924/01082* (2013.01); *H01L 2924/01322* (2013.01); *H01L 2924/12041* (2013.01); *H01L 2924/12042* (2013.01); *H01L 2924/1306* (2013.01); *H01L 2924/13091* (2013.01); *H01L 2924/14* (2013.01); *H01L 2924/181* (2013.01); *H01L 2924/3511* (2013.01)

(56) References Cited

U.S. PATENT DOCUMENTS

| | | | |
|---|---|---|---|
| 5,434,410 | A | 7/1995 | Kulwicki |
| 5,508,561 | A | 4/1996 | Tago et al. |
| 5,519,580 | A | 5/1996 | Natarajan et al. |
| 5,650,595 | A | 7/1997 | Bentlage et al. |
| 5,710,071 | A | 1/1998 | Beddingfield et al. |
| 5,844,782 | A | 12/1998 | Fukasawa |
| 5,869,886 | A | 2/1999 | Tokuno |
| 5,872,399 | A | 2/1999 | Lee |
| 5,889,326 | A * | 3/1999 | Tanaka .......................... 257/737 |
| 5,915,169 | A | 6/1999 | Heo |
| 5,926,731 | A * | 7/1999 | Coapman et al. ............. 438/613 |
| 5,985,456 | A | 11/1999 | Zhou et al. |
| 6,153,940 | A | 11/2000 | Zakel et al. |
| 6,177,730 | B1 * | 1/2001 | Kira ....................... H01L 21/563 257/734 |
| 6,201,305 | B1 | 3/2001 | Darveaux et al. |
| 6,214,642 | B1 * | 4/2001 | Chen et al. ................... 438/108 |
| 6,218,630 | B1 | 4/2001 | Takigami |
| 6,228,466 | B1 | 5/2001 | Tsukada et al. |
| 6,259,163 | B1 | 7/2001 | Ohuchi et al. |
| 6,281,450 | B1 | 8/2001 | Urasaki et al. |
| 6,297,560 | B1 | 10/2001 | Capote et al. |
| 6,324,754 | B1 | 12/2001 | DiStefano et al. |
| 6,329,605 | B1 | 12/2001 | Beroz et al. |
| 6,335,568 | B1 | 1/2002 | Yuzawa et al. |
| 6,335,571 | B1 | 1/2002 | Capote et al. |
| 6,392,143 | B1 * | 5/2002 | Koshio ......................... 174/528 |
| 6,396,707 | B1 | 5/2002 | Huang et al. |
| 6,441,316 | B1 | 8/2002 | Kusul |
| 6,448,665 | B1 | 9/2002 | Nakazawa et al. |
| 6,573,610 | B1 | 6/2003 | Tsai |
| 6,600,234 | B2 | 7/2003 | Kuwabara et al. |
| 6,608,388 | B2 | 8/2003 | Lin et al. |
| 6,710,458 | B2 | 3/2004 | Seko |
| 6,732,912 | B2 | 5/2004 | Tong et al. |
| 6,734,557 | B2 | 5/2004 | Taniguchi et al. |
| 6,774,474 | B1 | 8/2004 | Caletka et al. |
| 6,774,497 | B1 | 8/2004 | Qi et al. |
| 6,780,673 | B2 | 8/2004 | Venkateswaran |
| 6,780,746 | B2 | 8/2004 | Kinsman et al. |
| 6,787,918 | B1 | 9/2004 | Tsai et al. |
| 6,809,262 | B1 | 10/2004 | Hsu |
| 6,818,545 | B2 | 11/2004 | Lee et al. |
| 6,849,944 | B2 | 2/2005 | Murtuza et al. |
| 6,864,168 | B2 | 3/2005 | Chen et al. |
| 6,870,276 | B1 | 3/2005 | Moxham et al. |
| 6,888,255 | B2 | 5/2005 | Murtuza et al. |
| 6,913,948 | B2 | 7/2005 | Caletka et al. |
| 7,005,585 | B2 | 2/2006 | Ishizaki |
| 7,005,750 | B2 | 2/2006 | Liu |
| 7,049,705 | B2 | 5/2006 | Huang |
| 7,057,284 | B2 | 6/2006 | Chauhan et al. |
| 7,064,435 | B2 | 6/2006 | Chung et al. |
| 7,098,407 | B2 | 8/2006 | Kim et al. |
| 7,102,239 | B2 | 9/2006 | Pu et al. |
| 7,173,828 | B2 | 2/2007 | Lin et al. |
| 7,208,834 | B2 | 4/2007 | Lee et al. |
| 7,224,073 | B2 | 5/2007 | Kim et al. |
| 7,242,099 | B2 | 7/2007 | Lin et al. |
| 7,271,484 | B2 | 9/2007 | Reiss et al. |
| 7,294,929 | B2 | 11/2007 | Miyazaki |
| 7,317,245 | B1 | 1/2008 | Lee et al. |
| 7,432,188 | B2 | 10/2008 | Tsai et al. |
| 7,436,063 | B2 | 10/2008 | Miyata et al. |
| 7,462,942 | B2 | 12/2008 | Tan et al. |
| 7,642,660 | B2 | 1/2010 | Tay et al. |
| 7,750,457 | B2 | 7/2010 | Seko |
| 7,847,417 | B2 | 12/2010 | Araki et al. |
| 7,902,660 | B1 | 3/2011 | Lee et al. |

(56) References Cited

U.S. PATENT DOCUMENTS

| | | | |
|---|---|---|---|
| 7,902,678 | B2 | 3/2011 | Ohuchi et al. |
| 7,902,679 | B2 | 3/2011 | Lin et al. |
| 2001/0026959 | A1 | 10/2001 | Jimarez et al. |
| 2002/0053466 | A1* | 5/2002 | Kusui ............................ 174/260 |
| 2002/0151228 | A1* | 10/2002 | Kweon et al. ................ 439/887 |
| 2003/0001286 | A1 | 1/2003 | Kajiwara et al. |
| 2004/0056341 | A1 | 3/2004 | Endo et al. |
| 2004/0126927 | A1 | 7/2004 | Lin et al. |
| 2004/0169286 | A1 | 9/2004 | Shibata |
| 2004/0178481 | A1 | 9/2004 | Joshi et al. |
| 2004/0232562 | A1 | 11/2004 | Hortaleza et al. |
| 2005/0070085 | A1 | 3/2005 | Huang et al. |
| 2005/0103516 | A1 | 5/2005 | Kaneyuki |
| 2005/0176233 | A1 | 8/2005 | Joshi et al. |
| 2005/0212078 | A1* | 9/2005 | Kwon et al. .................. 257/672 |
| 2005/0224972 | A1 | 10/2005 | Domon et al. |
| 2005/0248037 | A1 | 11/2005 | Hung et al. |
| 2006/0131758 | A1 | 6/2006 | Dao |
| 2007/0025079 | A1* | 2/2007 | Salmon ......................... 361/688 |
| 2008/0093749 | A1 | 4/2008 | Gerber et al. |
| 2008/0253085 | A1 | 10/2008 | Soffer |

FOREIGN PATENT DOCUMENTS

| | | |
|---|---|---|
| JP | 04-334035 | 11/1992 |
| JP | 10-135272 | 5/1998 |
| JP | 10-256307 | 9/1998 |
| JP | 2000-031204 | 1/2000 |
| JP | 2000-138261 | 5/2000 |
| JP | 2001102409 | 4/2001 |
| JP | 2004-221205 | 5/2004 |

OTHER PUBLICATIONS

Riley, George A., "Introduction to Flip Chip: What, Why, How," posted Oct. 2000, Tutorial 1—Oct. 2000, http://www.flipchips.com/tutorial01.html.

"Solder Bump Flip Chip," Tutorial 2—Nov. 2000, http://www.flipchips.com/tutorial2a.html.

Riley, George A., "Stud Bump Flip Chip," Tutorial 3—Dec. 2000, http://www.flipchips.com/tutorial03.html.

Riley, George A., "Tutorial 11. Under Bump Metallization (UBM)," Tutorial 11—Sep. 2001, http://www.flipchips.com/tutorial11.html.

Riley, George A., "Gold Stud Bump Applications," Tutorial 24—Nov. 2002, http://www.flipchips.com/tutorial24.html.

Kawahara, Toshimi, "SuperCSP", IEEE Transactions on Advanced Packaging, May 2000, pp. 215-219, vol. 23, No. 2.

Lu, H. et al., "Predicting Optimal Process Conditions for Flip-Chip Assembly Using Copper Column Bumped Dies", Electronics Packaging Technology Conference, 2002, pp. 338-343.

Yamada, Hiroshi et al., "A fine pitch and high aspect ratio bump array for flip-chip interconnection", Int'l Electronics Manufacturing Technology Symposium, 1992, pp. 288-292, IEEE/CHMT.

Yamada, Hiroshi et al., "Advanced copper column based solder bump for flip-chip interconnection", International Symposium on Microelectronics, 1997, pp. 417-422, The British Library—"The world's knowledge".

* cited by examiner

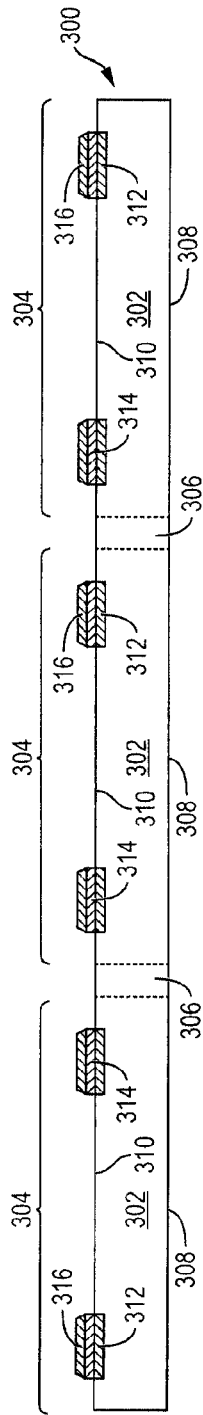
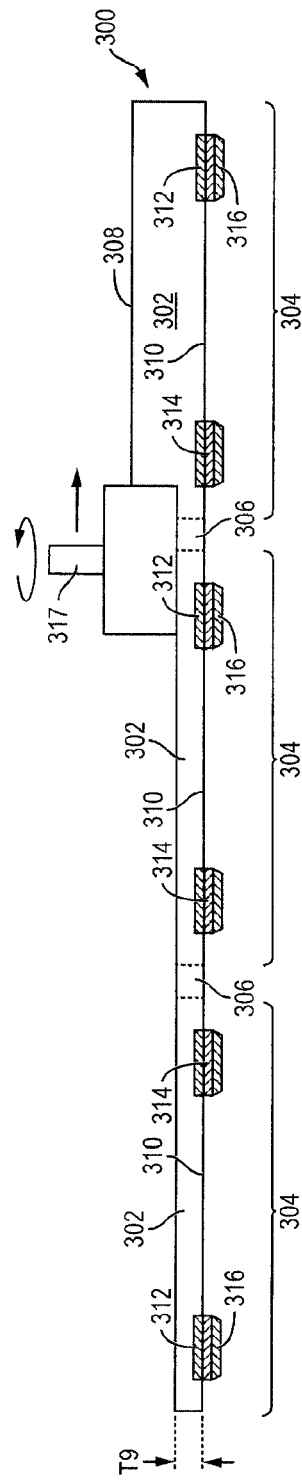
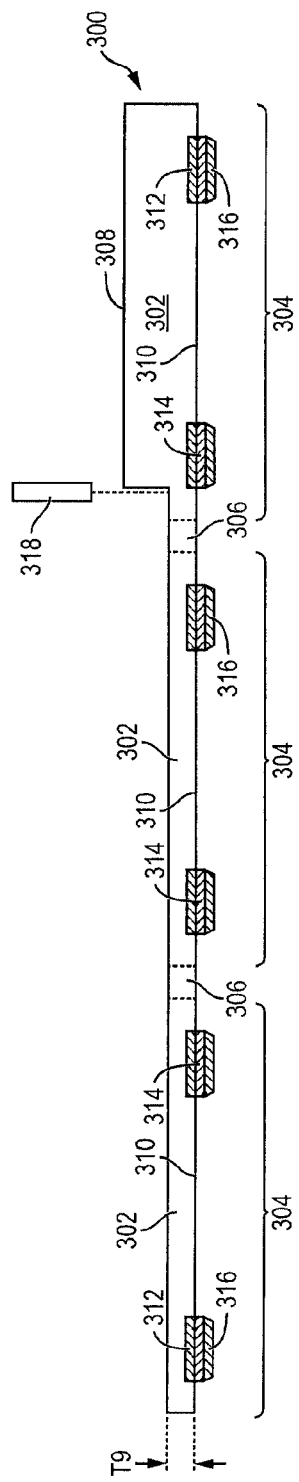
FIG. 13a
FIG. 13b
FIG. 13c

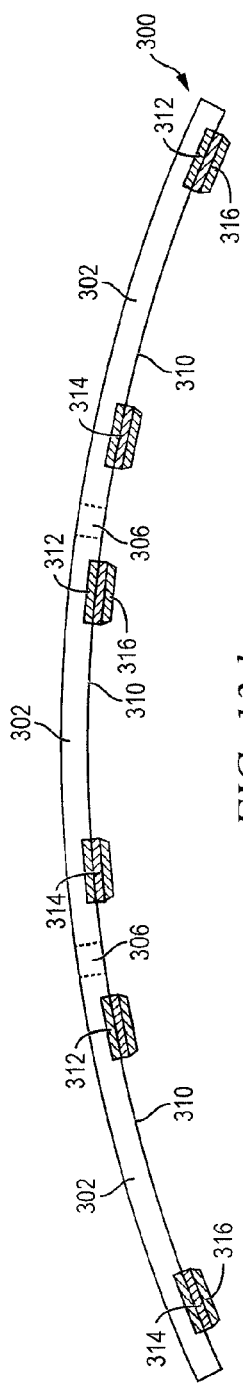
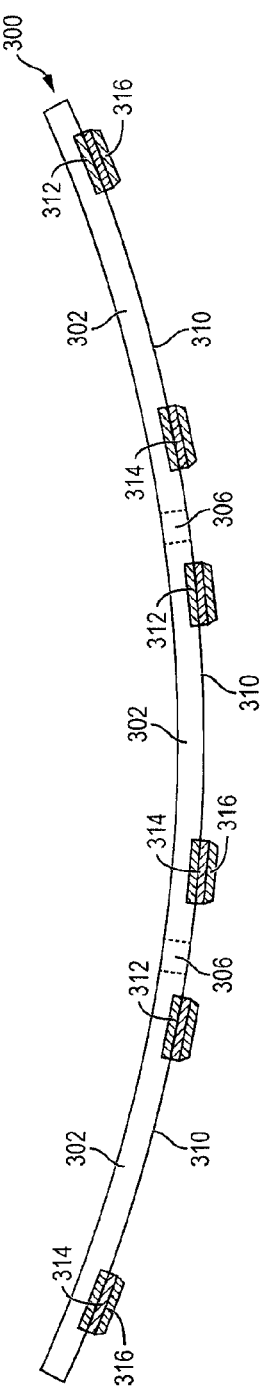
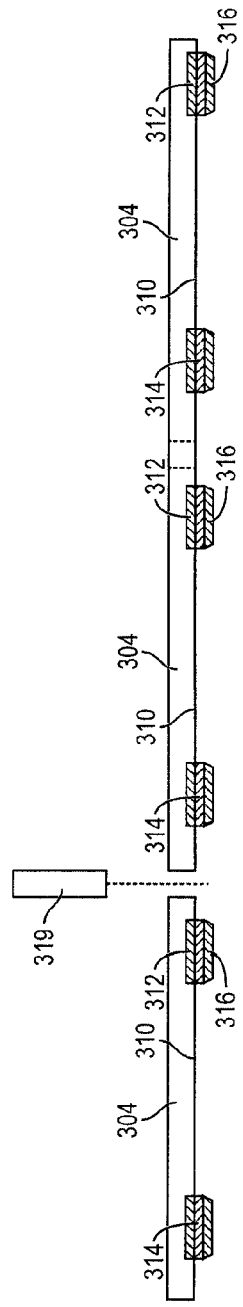
FIG. 13d
FIG. 13e
FIG. 13f

SEMICONDUCTOR DEVICE AND METHOD OF FORMING VERTICAL INTERCONNECT STRUCTURE BETWEEN SEMICONDUCTOR DIE AND SUBSTRATE

CLAIM TO DOMESTIC PRIORITY

The present application is a continuation-in-part of U.S. patent application Ser. No. 12/731,354, now U.S. Pat. No. 8,193,035, filed Mar. 25, 2010, which is continuation of U.S. patent application Ser. No. 11/525,493, filed Sep. 22, 2006, now U.S. Pat. No. 7,713,782, which applications are incorporated herein by reference.

FIELD OF THE INVENTION

The present invention relates in general to semiconductor devices and, more particularly, to a semiconductor device and method of forming a vertical interconnect structure between a semiconductor die and substrate.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as signal processing, high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each semiconductor die is typically identical and contains circuits formed by electrically connecting active and passive components. Back-end manufacturing involves singulating individual semiconductor die from the finished wafer and packaging the die to provide structural support and environmental isolation. The term "semiconductor die" as used herein refers to both the singular and plural form of the words, and accordingly, can refer to both a single semiconductor device and multiple semiconductor devices.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller semiconductor die size can be achieved by improvements in the front-end process resulting in semiconductor die with smaller, higher density active and passive components. Back-end processes may result in semiconductor device packages with a smaller footprint by improvements in electrical interconnection and packaging materials.

The packaging of a semiconductor die is among the final steps in the long chain of processes for manufacturing semiconductor integrated circuits. Semiconductor die packaging has a direct impact on the die performance and reliability as well as the performance and reliability of electronic devices in which the die are incorporated. In many instances, packaging involves mounting the semiconductor die to a substrate, e.g., in flipchip arrangement, with electrical interconnect, and then encapsulating the die in a manner that seals and protects the die from the external environmental contaminants. Packaging also can facilitate the conduction of heat away from the die during operation.

FIG. 1a shows a semiconductor die 10 from a semiconductor wafer with contact pads 12 formed over active surface 14 of the die. An under bump metallization (UBM) layer 16 is formed over contact pads 12. Semiconductor die 10 are formed at wafer fabrication facilities. Bumps 18 are formed over UBM layer 16. Substrate 20 includes conductive traces or bond pads 22. Semiconductor die 10 is brought in proximity of substrate 20 with bumps 18 contacting bond pads 22. Bumps 18 are reflowed to metallurgically and electrically connect semiconductor die 10 to substrate 20, as shown in FIG. 1b. Semiconductor die 10 are mounted to substrate 20 at a die assembly facility. Bumps 18 typically have a height of 70-100 micrometers (μm) and width or diameter of 100-125 μm, which imposes limits on the pitch and input/output (I/O) count or density for a given die size.

SUMMARY OF THE INVENTION

A need exists for a vertical interconnect structure between a semiconductor die and substrate to reduce pitch and increase I/O density. Accordingly, in one embodiment, the present invention is a method of making a semiconductor device comprising the steps of providing a semiconductor die, providing a substrate, forming a plurality of stud bumps over the semiconductor die or substrate, and mounting the semiconductor die to the substrate with the stud bumps electrically connecting the semiconductor die to the substrate.

In another embodiment, the present invention is a method of making a semiconductor device comprising the steps of providing a semiconductor die, providing a substrate, forming a conductive column over the semiconductor die or substrate, and mounting the semiconductor die to the substrate including a fixed offset between the semiconductor die and substrate. The conductive column electrically connects the semiconductor die to the substrate.

In another embodiment, the present invention is a method of making a semiconductor device comprising the steps of providing a semiconductor die, providing a substrate, forming a vertical interconnect structure over the semiconductor die or substrate, and mounting the semiconductor die to the substrate including a fixed offset between the semiconductor die and substrate. The vertical interconnect structure electrically connects the semiconductor die to the substrate.

In another embodiment, the present invention is a semiconductor device comprising a semiconductor die, substrate, and vertical interconnect structure formed between the semiconductor die and substrate with a fixed offset to electrically connect the semiconductor die to the substrate.

BRIEF DESCRIPTION OF THE DRAWINGS

FIGS. 13a-13f illustrate a process of forming a flexible semiconductor wafer;

DETAILED DESCRIPTION OF THE DRAWINGS

Figure 1A:
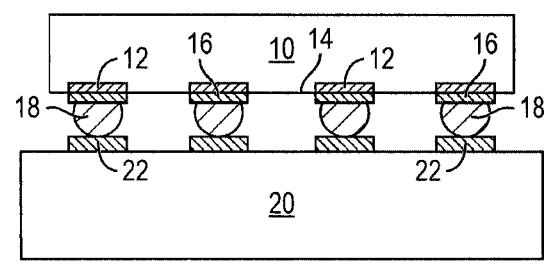
FIGS. 1a-1b illustrate a conventional semiconductor die mounted to a substrate using a plurality of bumps.
Figure 1B:
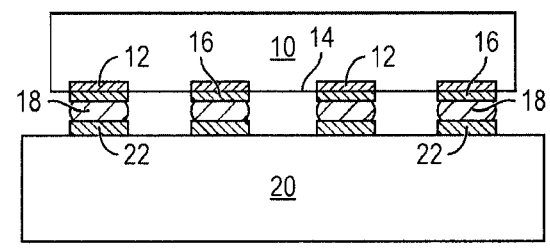

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition can involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. In one embodiment, the portion of the photoresist pattern subjected to light is removed using a solvent, exposing portions of the underlying layer to be patterned. In another embodiment, the portion of the photoresist pattern not subjected to light, the negative photoresist, is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Patterning is the basic operation by which portions of the top layers on the semiconductor wafer surface are removed. Portions of the semiconductor wafer can be removed using photolithography, photomasking, masking, oxide or metal removal, photography and stenciling, and microlithography. Photolithography includes forming a pattern in reticles or a photomask and transferring the pattern into the surface layers of the semiconductor wafer. Photolithography forms the horizontal dimensions of active and passive components on the surface of the semiconductor wafer in a two-step process. First, the pattern on the reticle or masks is transferred into a layer of photoresist. Photoresist is a light-sensitive material that undergoes changes in structure and properties when exposed to light. The process of changing the structure and properties of the photoresist occurs as either negative-acting photoresist or positive-acting photoresist. Second, the photoresist layer is transferred into the wafer surface. The transfer occurs when etching removes the portion of the top layers of semiconductor wafer not covered by the photoresist. The chemistry of photoresists is such that the photoresist remains substantially intact and resists removal by chemical etching solutions while the portion of the top layers of the semiconductor wafer not covered by the photoresist is removed. The process of forming, exposing, and removing the photoresist, as well as the process of removing a portion of the semiconductor wafer can be modified according to the particular resist used and the desired results.

In negative-acting photoresists, photoresist is exposed to light and is changed from a soluble condition to an insoluble condition in a process known as polymerization. In polymerization, unpolymerized material is exposed to a light or energy source and polymers form a cross-linked material that is etch-resistant. In most negative resists, the polymers are polyisopremes. Removing the soluble portions (i.e., the portions not exposed to light) with chemical solvents or developers leaves a hole in the resist layer that corresponds to the opaque pattern on the reticle. A mask whose pattern exists in the opaque regions is called a clear-field mask.

In positive-acting photoresists, photoresist is exposed to light and is changed from relatively nonsoluble condition to much more soluble condition in a process known as photosolubilization. In photosolubilization, the relatively insoluble resist is exposed to the proper light energy and is converted to a more soluble state. The photosolubilized part of the resist can be removed by a solvent in the development process. The basic positive photoresist polymer is the phenol-formaldehyde polymer, also called the phenol-formaldehyde novolak resin. Removing the soluble portions (i.e., the portions exposed to light) with chemical solvents or developers leaves a hole in the resist layer that corresponds to the transparent pattern on the reticle. A mask whose pattern exists in the transparent regions is called a dark-field mask.

After removal of the top portion of the semiconductor wafer not covered by the photoresist, the remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual semiconductor die and then packaging the semiconductor die for structural support and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

Figure 2:
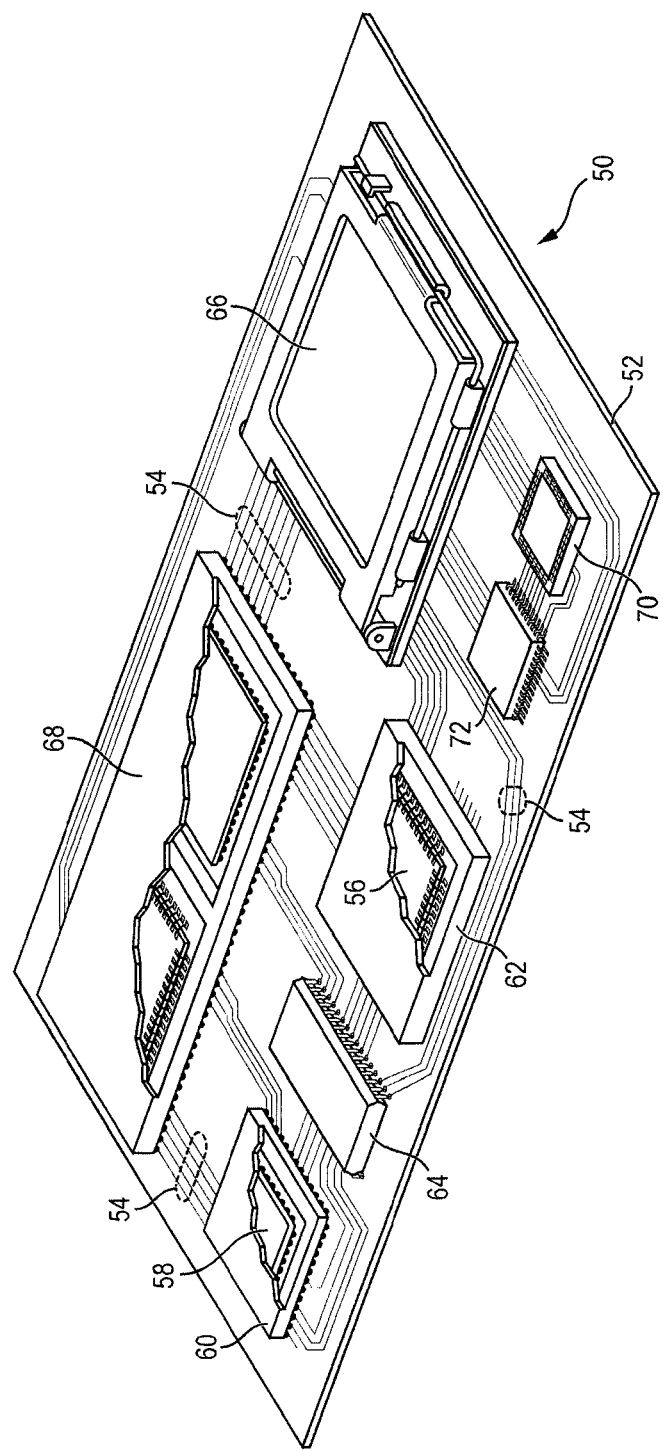
FIG. 2 illustrates a printed circuit board (PCB) with different types of packages mounted to its surface.

FIG. 2 illustrates electronic device 50 having a chip carrier substrate or PCB 52 with a plurality of semiconductor packages mounted on its surface. Electronic device 50 can have one type of semiconductor package, or multiple types of semiconductor packages, depending on the application. The different types of semiconductor packages are shown in FIG. 2 for purposes of illustration.

Electronic device 50 can be a stand-alone system that uses the semiconductor packages to perform one or more electrical functions. Alternatively, electronic device 50 can be a subcomponent of a larger system. For example, electronic device 50 can be part of a cellular phone, personal digital assistant (PDA), digital video camera (DVC), or other electronic communication device. Alternatively, electronic device 50 can be a graphics card, network interface card, or other signal processing card that can be inserted into a computer. The semiconductor package can include microprocessors, memories, application specific integrated circuits (ASIC), logic circuits, analog circuits, RF circuits, discrete devices, or other semiconductor die or electrical components. Miniaturization and weight reduction are essential for these products to be accepted by the market. The distance between semiconductor devices must be decreased to achieve higher density.

In FIG. 2, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including bond wire package 56 and flipchip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using less expensive components and a streamlined manufacturing process. The resulting devices are less likely to fail and less expensive to manufacture resulting in a lower cost for consumers.

Figure 3A:
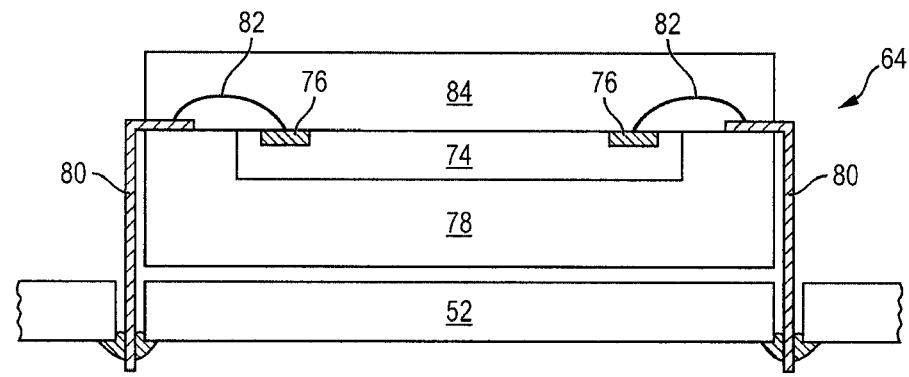
FIGS. 3a-3c illustrate further detail of the representative semiconductor packages mounted to the PCB.
Figure 3B:
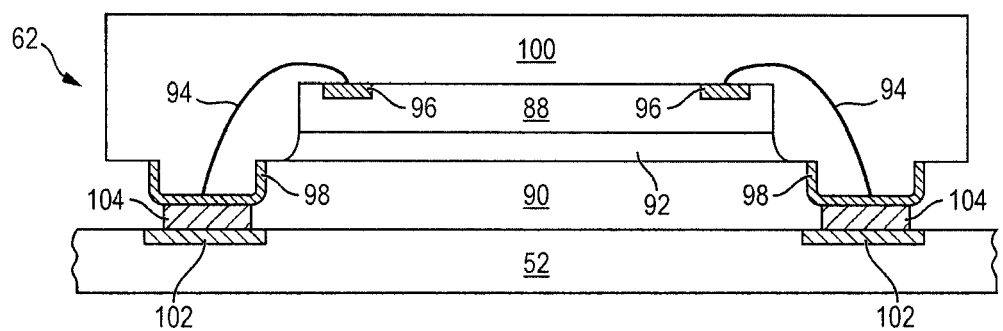
Figure 3C:
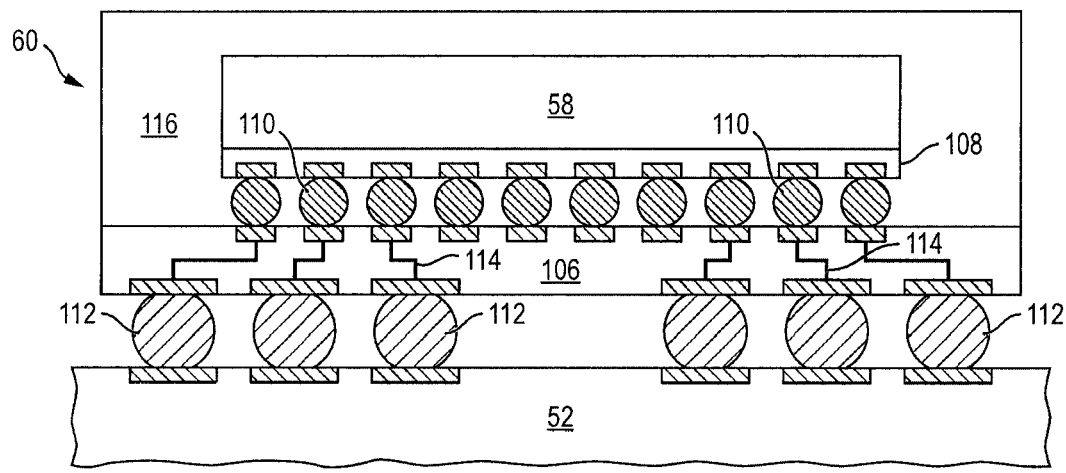

FIGS. 3a-3c show exemplary semiconductor packages. FIG. 3a illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit can include one or more transistors, diodes, inductors, capacitors, resistors, and other circuit elements formed within the active region of semiconductor die 74. Contact pads 76 are one or more layers of conductive material, such as aluminum (Al), Cu, tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy or epoxy resin. The package body includes an insulative packaging material such as polymer or ceramic. Conductor leads 80 and bond wires 82 provide electrical interconnect between semiconductor die 74 and PCB 52. Encapsulant 84 is deposited over the package for environmental protection by preventing moisture and particles from entering the package and contaminating semiconductor die 74 or bond wires 82.

FIG. 3b illustrates further detail of BCC 62 mounted on PCB 52. Semiconductor die 88 is mounted over carrier 90 using an underfill or epoxy-resin adhesive material 92. Bond wires 94 provide first level packaging interconnect between contact pads 96 and 98. Molding compound or encapsulant 100 is deposited over semiconductor die 88 and bond wires 94 to provide physical support and electrical isolation for the device. Contact pads 102 are formed over a surface of PCB 52 using a suitable metal deposition process such as electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

In FIG. 3c, semiconductor die 58 is mounted face down to intermediate carrier 106 with a flipchip style first level packaging. Active region 108 of semiconductor die 58 contains analog or digital circuits implemented as active devices, passive devices, conductive layers, and dielectric layers formed according to the electrical design of the die. For example, the circuit can include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flipchip semiconductor device provides a short electrical conduction path from the active devices on semiconductor die 58 to conduction tracks on PCB 52 in order to reduce signal propagation distance, lower capacitance, and improve overall circuit performance. In another embodiment, semiconductor die 58 can be mechanically and electrically connected directly to PCB 52 using flipchip style first level packaging without intermediate carrier 106.

Figure 4A:
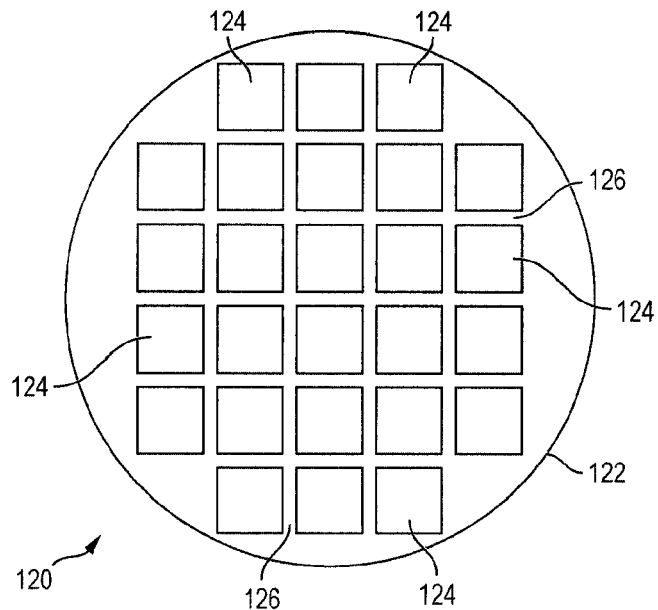
FIGS. 4a-4e illustrate a semiconductor wafer with a plurality of semiconductor die separated by a saw street.

FIG. 4a shows a semiconductor wafer 120 with a base substrate material 122, such as silicon, germanium, gallium arsenide, indium phosphide, or silicon carbide, for structural support. A plurality of semiconductor die or components 124 is formed on wafer 120 separated by a non-active, inter-die wafer area or saw street 126 as described above. Saw street 126 provides cutting areas to singulate semiconductor wafer 120 into individual semiconductor die 124.

Figure 4B:
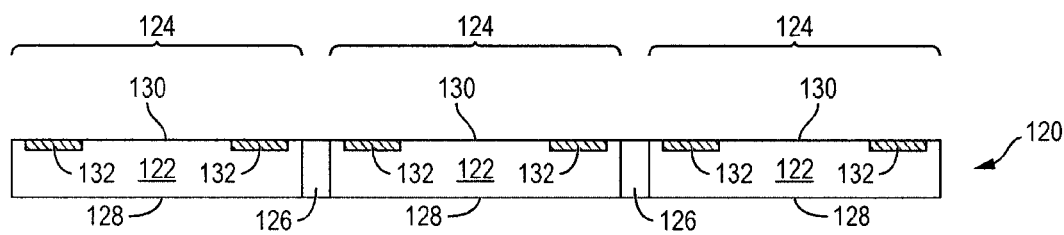

FIG. 4b shows a cross-sectional view of a portion of semiconductor wafer 120. Each semiconductor die 124 has a back surface 128 and active surface 130 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 130 to implement analog circuits or digital circuits, such as digital signal processor (DSP), ASIC, memory, or other signal processing circuit. Semiconductor die 124 may also contain integrated passive devices (IPDs), such as inductors, capacitors, and resistors, for RF signal processing.

An electrically conductive layer 132 is formed over active surface 130 using PVD, CVD, electrolytic plating, electroless plating process, or other suitable metal deposition process. Conductive layer 132 can be one or more layers of Al, Cu, Sn, Ni, Au, Ag, or other suitable electrically conductive material. Conductive layer 132 operates as contact pads electrically connected to the circuits on active surface 130. Contact pads 132 can be disposed side-by-side a first distance from the edge of semiconductor die 124, as shown in FIG. 4b. Alternatively, contact pads 132 can be offset in multiple rows such that a first row of contact pads is disposed a first distance from the edge of the die, and a second row of contact pads alternating with the first row is disposed a second distance from the edge of the die.

Figure 4C:
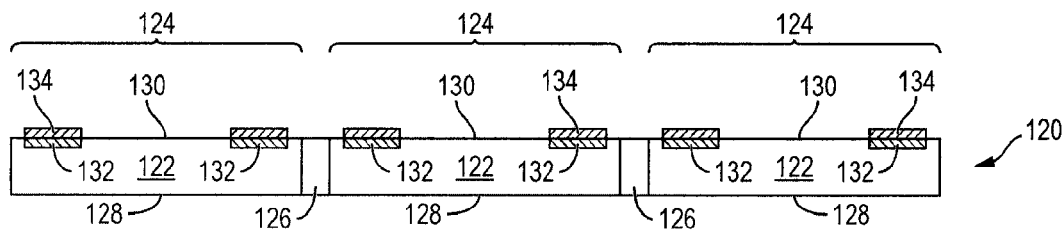

In FIG. 4c, an electrically conductive layer 134 is formed over conductive layer 132 using PVD, CVD, evaporation, sputtering, chemical plating, electrolytic plating, electroless plating, or other suitable metal deposition process. A mask can be used to define the location of conductive layer 134. In cases where conductive layer 132 is Al, any aluminum oxide is removed prior to forming conductive layer 134. The aluminum oxide can be removed by sputter etching, plasma etching, ion etching, or wet etching. Conductive layer 134 can be one or more layers of Cr, Cu, Ti, Ni, V, W, Au, alloys thereof, or other suitable electrically conductive material. Conductive layer 134 operates as an UBM layer.

Conductive layer 134 can be formed with multiple layers including a gradient of compatibility materials. An adhesion layer is formed over conductive layer 132 for a strong, low-stress, low-resistance, mechanical and electrical connection to the underlying conductive layer. The adhesion layer has a thickness of 0.1 to 3 μm. A diffusion barrier layer is formed over the adhesion layer to inhibit diffusion of contaminants from a later formed fusible layer into active surface 130. The diffusion barrier layer has a thickness of 0.05 to 5 μm. A wettable layer is formed over the diffusion barrier layer for reliable bonding and adhesion to the fusible layer. The wettable layer has a thickness of 0.1 to 5 μm. An optional protective layer can be formed over a portion of the wettable layer to protect the underlying material from oxidation and other environmental contaminants. The protective layer has a thickness of 0.05 to 3 μm. The overall thickness of conductive layer 134 is 0.1 to 5 μm.

In one embodiment, an adhesion layer of Ti/Cr/Al is formed over the exposed conductive layer 132 with thickness of 0.1 μm. A diffusion barrier layer of Cr:Cu is formed over the adhesion layer with a thickness of 0.08 μm. A wettable layer of Cu/Ni:V is formed over the diffusion-barrier layer with a thickness of 0.3 μm. A protective layer of Au is formed over the wettable layer with a thickness of 0.05 μm. In other cases, the multiple UBM layers can include Cr:Cr—Cu:Cu, Ti:Ni—V, Ti:Cu, Ti:W:Au, Ni:Au, Al/Ni/Cu, Al/NiV/Cu, and Ti:Cu:Ni.

Figure 4D:
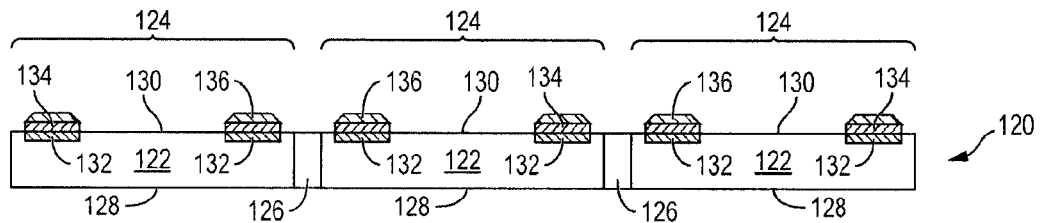

In FIG. 4d, an electrically conductive fusible layer 136 is formed over conductive layer 134 using screen-printing of conductive paste, plating, and other suitable metal deposition processes. Conductive layer 134 defines and limits the formation of fusible layer 136. Fusible layer 136 can be formed with the same mask used for conductive layer 134 to remove the need for a separate deposition step. Fusible layer 136 is bonded to conductive layer 134 using a suitable attachment or bonding process, including thermal compression bonding. Fusible layer 136 can be Sn, eutectic Sn/Pb, lead-free solder, binary alloys such as Sn—Pb, Sn—Bi, Sn—Cu, Sn—Ag, and Sn—Sb, ternary alloys such as Sn—Ag—Cu, and other suitable fusible material. Fusible layer 136 is thinner than conventional bump 18 shown in FIG. 1a. In one embodiment, fusible layer 136 has a thickness of 0.5 to 50 μm.

In some embodiments where fusible layer 136 does not pose a contamination concern for semiconductor die 124, conductive layer 134 can be formed with fewer layers or eliminated completely. Accordingly, conductive layer 132 and fusible layer 136 can be formed, with or without conductive layer 134, on semiconductor die 124 at the wafer level entirely in a wafer fabrication facility. In particular, conductive layers 132-134 and fusible layer 136 can be formed in the wafer fabrication facility using thin-film sputtering.

Figure 4E:
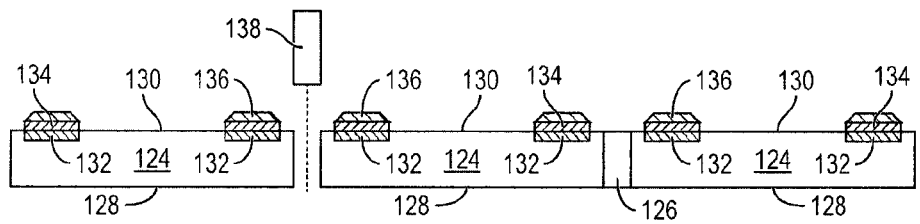

In FIG. 4e, semiconductor wafer 120 is singulated through saw street 126 with saw blade or laser cutting tool 138 into individual semiconductor die 124 with conductive layer 134 and fusible layer 136.

Figure 5A:
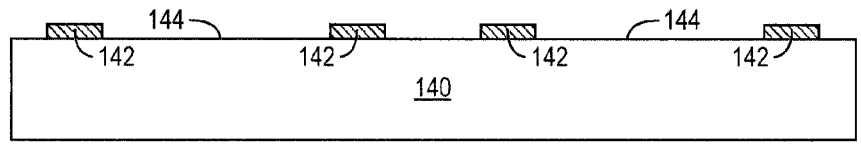
FIGS. 5a-5g illustrate a process of forming non-fusible stud bumps over a substrate and mounting a semiconductor die to the substrate.

FIGS. 5a-5g illustrate, in relation to FIGS. 2 and 3a-3c, a process of forming non-fusible stud bumps over a substrate and mounting a semiconductor die to the substrate. FIG. 5a shows substrate 140 with an electrically conductive layer 142 formed over surface 144 using electrolytic plating, electroless plating process, or other suitable metal deposition process. Substrate 140 can be a carrier, leadframe, PCB, or other supporting structure. Conductive layer 142 includes one or more layers of Al, Cu, Sn, Ni, Au, Ag, or other suitable electrically conductive material. Conductive layer 142 operates as trace routing and bond pads formed at locations on substrate 140 corresponding to fusible layer 136 of semiconductor die 124.

Figure 5B:
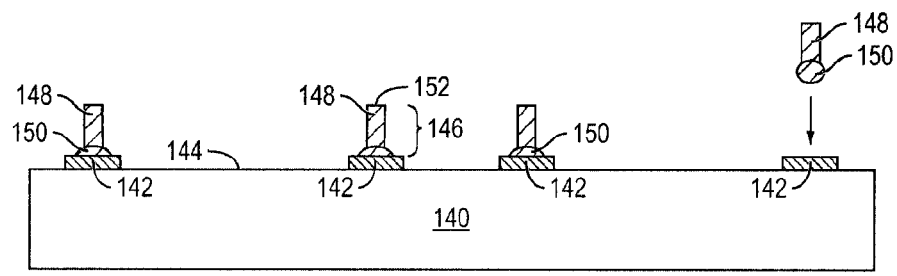

In FIG. 5b, a plurality of non-fusible stud bumps or stud pedestals 146 is formed over conductive layer 142 as a vertical interconnect structure. Stud bumps 146 include a wire 148 attached to conductive layer 142. Wire 148 can be Au, Cu, alloys of Au or Cu, or other non-fusible conductive material. One end of wire 148 is melted to form a sphere or ball 150. The ball end or base 150 of wire 148 is pressed onto conductive layer 142 with mechanical force, heat, and ultrasonic energy using a wire-bonding tool. Base 150 is metallurgically and electrically connected to conductive layer 142, leaving the base flattened against the bond pad with a diameter or width of 30-75 μm. Base 150 penetrates through any oxide layer on conductive layer 142. After bonding base 150 to conductive layer 142, distal end 152 of wire 148 is cut to the desired length for stud bumps 146. In one embodiment, stud bumps 146 have a height of 30-60 μm. In addition, distal end 152 can be flattened or coined by mechanical pressure or other suitable process. Distal end 152 of wires 148 can be individually flattened one-by-one, or wires 148 can be collectively flattened by pressing a plate with a flat surface against the wires simultaneously. The flattened distal end 152 provides a uniform stud bump height. Stud bumps 146 provide a non-fusible, reliable, and fixed connection to conductive layer 142 on substrate 140.

Figure 5C:
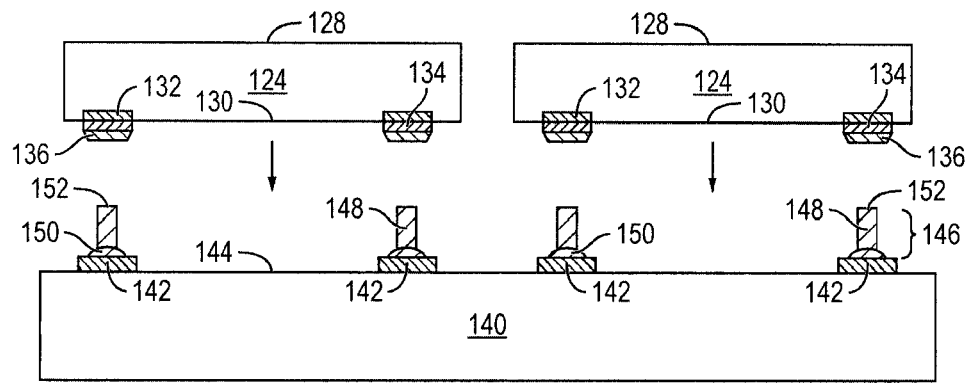
Figure 5D:
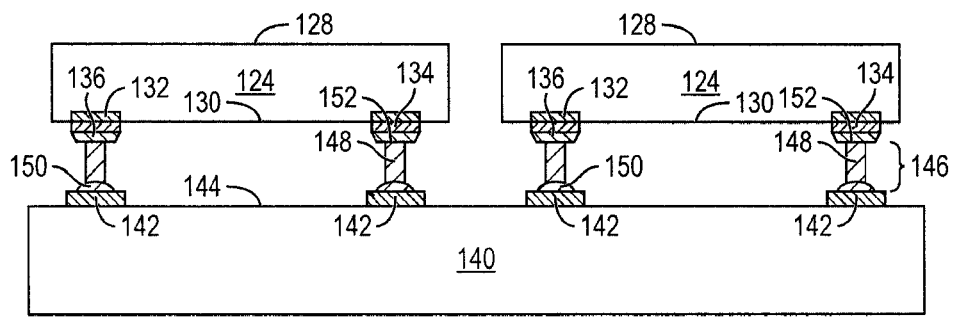
Figure 5E:
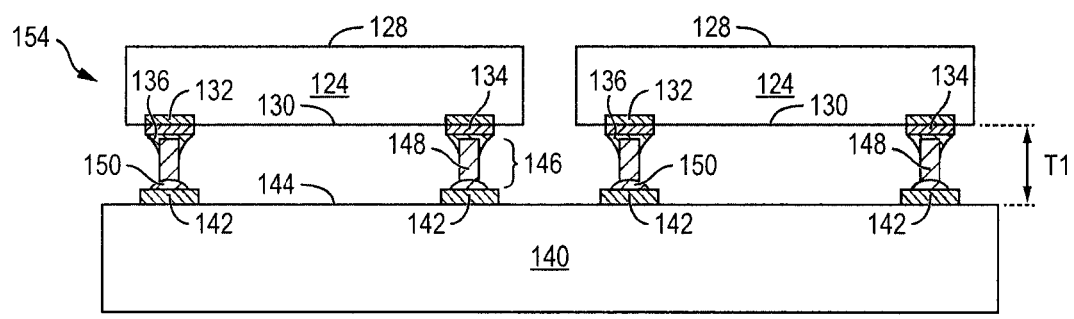

FIG. 5c shows semiconductor die 124 from FIG. 4e positioned over substrate 140 using a pick and place operation with active surface 130 oriented toward the substrate and fusible layer 136 aligned with stud bumps 146. In FIG. 5d, semiconductor die 124 is brought into proximity of substrate 140 with accurate registration so that fusible layer 136 contacts distal end 152 of wires 148. Fusible layer 136 is reflowed to metallurgically and electrically connect the fusible layer with the respective stud bumps 146. Alternatively, fusible layer 136 is metallurgically and electrically connected to the respective stud bumps 146 by thermal compression bonding, e.g., 30 MPa of pressure at 300° C. for 2 minutes. FIG. 5e shows semiconductor die 124 mounted to substrate 140 with fusible layer 136 bonded to respective stud bumps 146. Fusible layer 136 coalesces around distal end 152 of wires 148 and solidifies to harden the vertical interconnect structure between semiconductor die 124 and substrate 140. The multiple semiconductor 124 mounted to substrate 140 constitute a reconstituted semiconductor wafer 154.

Figure 5F:
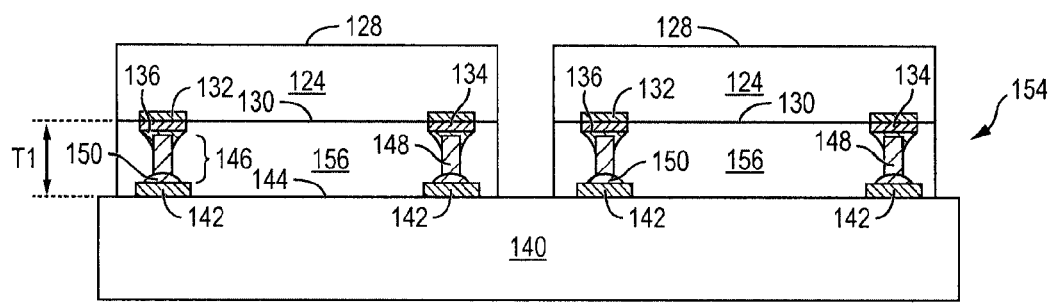

The non-fusible nature of stud bumps 146 creates a fixed offset T1 between semiconductor die 124 and substrate 140. In one embodiment, the fixed offset T1 is 30-60 μm. An underfill material 156, such as epoxy resin, is deposited between semiconductor die 124 and substrate 140 by needle dispensing along one or more edges of the semiconductor die, as shown in FIG. 5f. The surfaces of semiconductor die 124 and substrate 140 can be cleaned prior to depositing underfill material 156. The underfill material 156 is drawn into the space between semiconductor die 124 and substrate 140 by capillary action. Alternatively, underfill material 156 is injected between semiconductor die 124 and substrate 140 with vacuum assist. The underfill material 156 is cured with heat. The underfill material 156 protects stud bumps 146 from moisture and environmental contaminants and provides mechanical support for the assembly. In addition, underfill material 156 compensates for thermal expansion differences between semiconductor die 124 and substrate 140. Any differences in thermal expansion between semiconductor die 124 and substrate 140 is distributed across underfill material 156 to relieve stress on stud bumps 146.

Figure 5G:
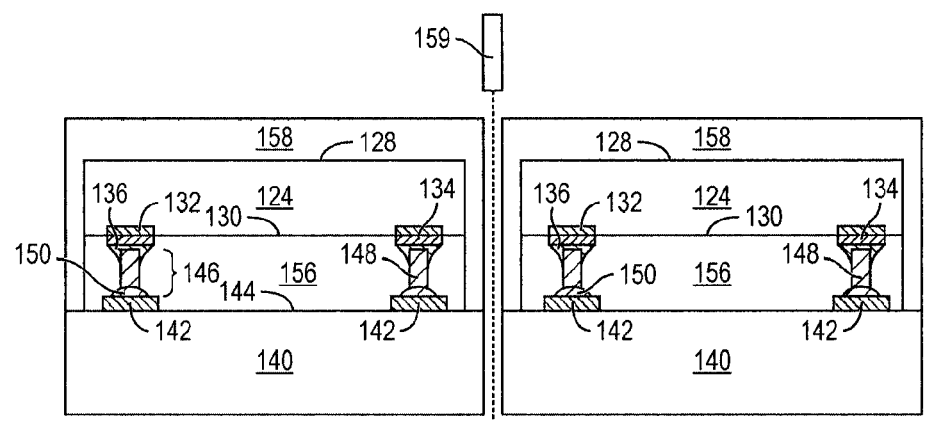

In FIG. 5g, an encapsulant or molding compound 158 is deposited over semiconductor die 124 and substrate 140 using a paste printing, compressive molding, transfer molding, liquid encapsulant molding, vacuum lamination, spin coating, or other suitable applicator. Encapsulant 158 can be polymer composite material, such as epoxy resin with filler, epoxy acrylate with filler, or polymer with proper filler. The viscosity of encapsulant 158 is selected for uniform coverage, e.g., a lower viscosity increases the flow of the encapsulant. Encapsulant 158 is non-conductive and environmentally protects the semiconductor device from external contaminants.

The reconstituted wafer 154 is singulated through encapsulant 158 and substrate 140 using saw blade or laser cutting tool 159.

The vertical interconnect structure between semiconductor die 124 and substrate 140, including conductive layers 132 and 142, fusible layer 136, and stud bumps 146, provide a fine pitch, e.g., 70 μm or less, for a high I/O count application. The offset T1 provides vertical standoff for ready application of underfill material 156. The vertical interconnect structure can be formed on active surface 130, or in a peripheral region around semiconductor die 124. Fusible layer 136 and stud bumps 146 can be lead-free to eliminate a potential source of contamination.

The vertical interconnect structure is suitable for partial wafer fabrication and partial die assembly. Substrate 140 with conductive layer 142 and stud bumps 150 can be formed in a die assembly facility. Semiconductor wafer 120 with conductive layers 132-134 and fusible layer 136 are formed at wafer fabrication and then singulated and mounted to substrate 140 at the die assembly facility to increase throughput and lower costs.

Figure 6A:
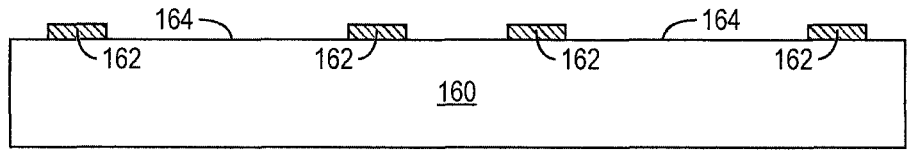
FIGS. 6a-6g illustrate a process of forming fusible stud bumps over a substrate and mounting a semiconductor die to the substrate.

FIGS. 6a-6g illustrate an embodiment of forming fusible stud bumps over a substrate and mounting a semiconductor die to the substrate. FIG. 6a shows substrate 160 with an electrically conductive layer 162 formed over surface 164 using electrolytic plating, electroless plating process, or other suitable metal deposition process. Substrate 160 can be a carrier, leadframe, PCB, or other supporting structure. Conductive layer 162 can be one or more layers of Al, Cu, Sn, Ni, Au, Ag, or other suitable electrically conductive material. Conductive layer 162 operates as bond pads formed at predetermined locations on substrate 160.

Figure 6B:
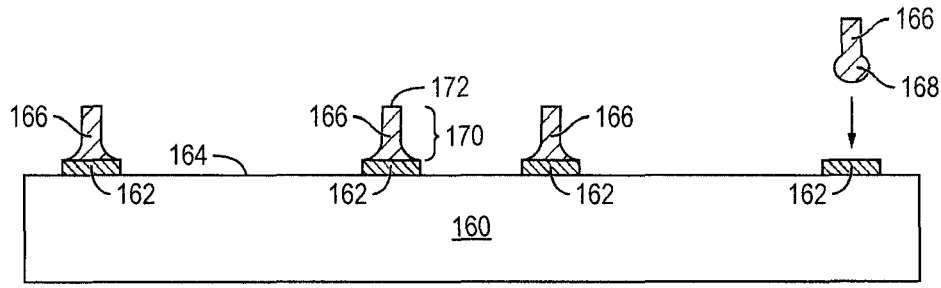

In FIG. 6b, a fusible wire 166 is attached to conductive layer 162. Wire 166 can be Sn, eutectic Sn/Pb, lead-free solder, binary alloys such as Sn—Pb, Sn—Bi, Sn—Cu, Sn—Ag, and Sn—Sb, ternary alloys such as Sn—Ag—Cu, and other suitable fusible material. One end of wire 166 is melted to form a sphere or ball 168. The ball end or base 168 of wire 166 is pressed under force against conductive layer 162, melted with the application of heat, and then re-solidified to metallurgically and electrically connect to conductive layer 162. After bonding base 168 to conductive layer 162, distal end 172 of wire 166 is cut to the desired length for fusible stud bumps 170. In one embodiment, fusible stud bumps 170 have a height of 30-60 μm. In addition, distal end 172 can be flattened or coined by mechanical pressure or other suitable process. Distal end 172 of wires 166 can be individually flattened one-by-one, or wires 166 can be collectively flattened by pressing a plate with a flat surface against the wires simultaneously. The flattened distal end 172 provides a uniform stud bump height. Stud bumps 170 provide a fusible, reliable, and fixed vertical interconnect structure.

Figure 6C:
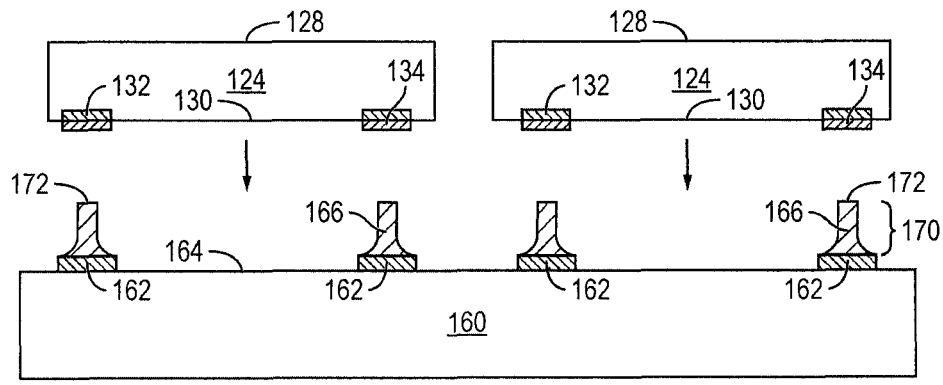
Figure 6D:
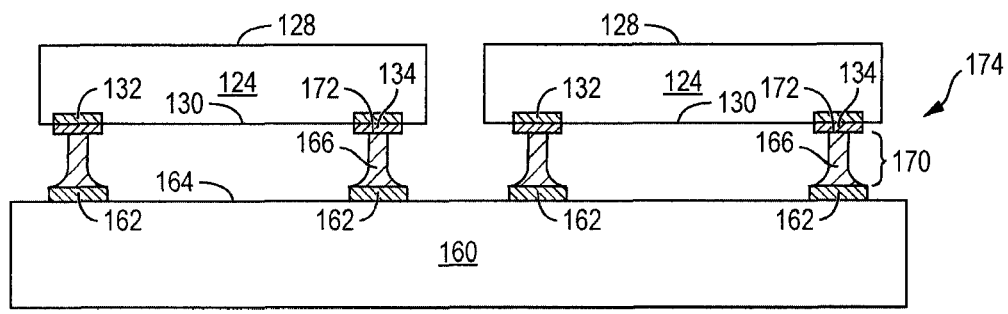
Figure 6E:
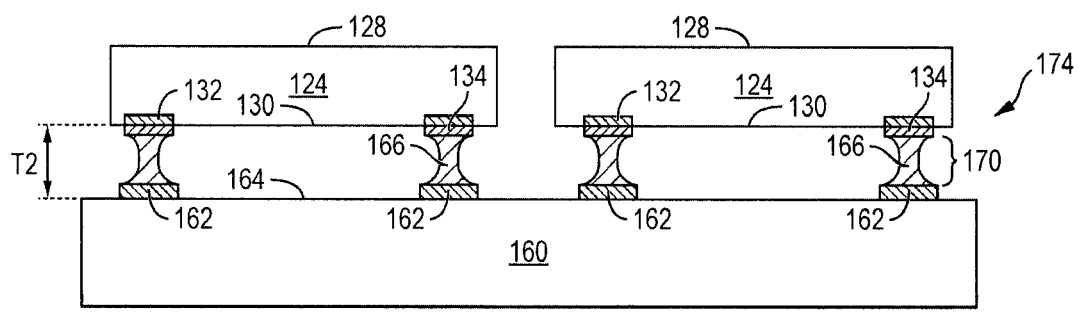

FIG. 6c shows semiconductor die 124, in the present embodiment without fusible layer 136. By forming conductive layer 134 without fusible layer 136, there is less chance of contamination of active surface 130. Semiconductor die 124 is positioned over substrate 160 using a pick and place operation with active surface 130 oriented toward the substrate and conductive layer 134 aligned with stud bumps 170. In FIG. 6d, semiconductor die 124 is brought into proximity of substrate 160 with accurate registration so that conductive layer 134 contacts stud bumps 170. Fusible stud bumps 170 are reflowed to metallurgically and electrically connect conductive layer 134 to the respective stud bumps. Alternatively, conductive layer 134 is metallurgically and electrically connected to the respective stud bumps 170 by thermal compression bonding, e.g., 30 MPa of pressure at 300° C. for 2 minutes. FIG. 6e shows semiconductor die 124 mounted to substrate 160 with conductive layer 134 bonded to respective fusible stud bumps 170. Fusible stub bumps 170 coalesce around conductive layer 134. The multiple semiconductor 124 mounted to substrate 160 constitutes a reconstituted semiconductor wafer 174. Stud bumps 170 create a fixed offset T2 between semiconductor die 124 and substrate 160. In one embodiment, the fixed offset T2 is 30-60 μm.

Figure 6F:
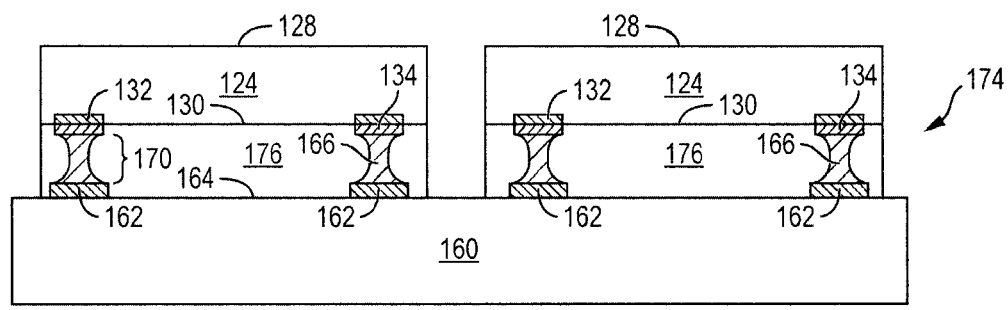

In FIG. 6f, an underfill material 176 such as epoxy resin, is deposited between semiconductor die 124 and substrate 160 by needle dispensing along one or more edges of the semiconductor die. The surfaces of semiconductor die 124 and substrate 160 can be cleaned prior to depositing underfill material 176. The underfill material 176 is drawn into the space between semiconductor die 124 and substrate 160 by capillary action. Alternatively, underfill material 176 is injected between semiconductor die 124 and substrate 160 with vacuum assist. The underfill material 176 is cured with heat. The underfill material 176 protects stud bumps 170 from moisture and environmental contaminants and provides mechanical support for the assembly. In addition, underfill material 176 compensates for thermal expansion differences between semiconductor die 124 and substrate 160. Any differences in thermal expansion between semiconductor die 124 and substrate 160 is distributed across underfill material 176 to relieve stress on stud bumps 170.

Figure 6G:
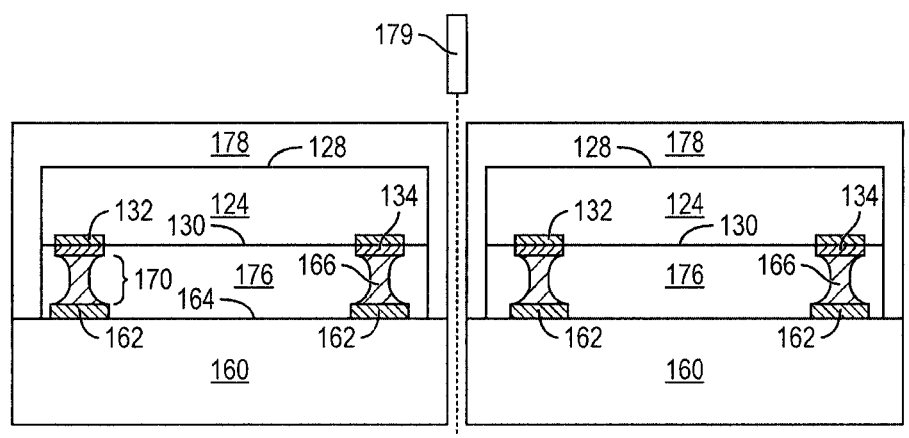

In FIG. 6g, an encapsulant or molding compound 178 is deposited over semiconductor die 124 and substrate 160 using a paste printing, compressive molding, transfer molding, liquid encapsulant molding, vacuum lamination, spin coating, or other suitable applicator. Encapsulant 178 can be polymer composite material, such as epoxy resin with filler, epoxy acrylate with filler, or polymer with proper filler. The viscosity of encapsulant 178 is selected for uniform coverage, e.g., a lower viscosity increases the flow of the encapsulant. Encapsulant 178 is non-conductive and environmentally protects the semiconductor device from external contaminants.

The reconstituted wafer 174 is singulated through encapsulant 178 and substrate 160 using saw blade or laser cutting tool 179.

The vertical interconnect structure between semiconductor die 124 and substrate 160, including conductive layers 132 and 162 and stud bumps 170, provide a fine pitch for a high I/O count application. The offset T2 provides vertical standoff for ready application of underfill material 176. The vertical interconnect structure can be formed on active surface 130, or in a peripheral region around semiconductor die 124. Stud bumps 170 can be lead-free to eliminate a potential source of contamination.

The vertical interconnect structure is suitable for partial wafer fabrication and partial die assembly. Substrate 160 with conductive layer 162 and stud bumps 170 can be formed in a die assembly facility. Semiconductor wafer 120 with conductive layers 132-134 are formed at wafer fabrication and then singulated and mounted to substrate 160 at the die assembly facility to increase throughput and lower costs.

Figure 7A:
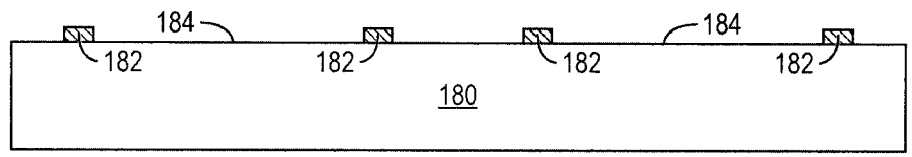
FIGS. 7a-7g illustrate a process of forming BOT stud bumps over a substrate and mounting a semiconductor die to the substrate.

FIGS. 7a-7g illustrate an embodiment of forming BOT stud bumps over a substrate and mounting a semiconductor die to the substrate. FIG. 7a shows substrate 180 with an electrically conductive layer 182 formed over surface 184 using electrolytic plating, electroless plating process, extrusion, or other suitable metal deposition process. Substrate 180 can be a carrier, leadframe, PCB, or other supporting structure. Conductive layer 182 can be one or more layers of Al, Cu, Sn, Ni, Au, Ag, or other suitable electrically conductive material. Conductive layer 182 is a narrow trace with a width of 5-50 μm routed across surface 184 of substrate 180.

Figure 7B:
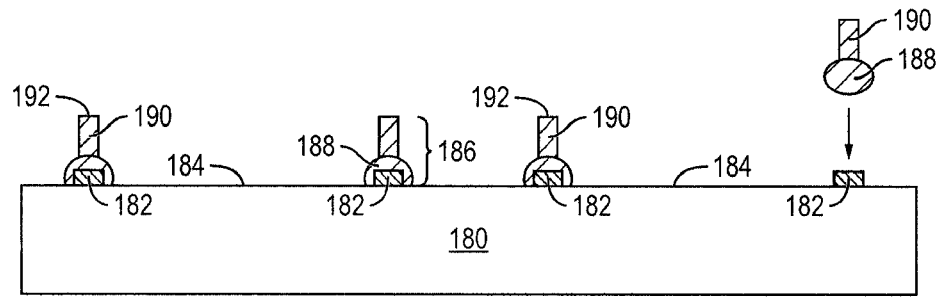

In FIG. 7b, a plurality of stud bumps or stud pedestals 186 is formed over conductive layer 182. Stud bumps 186 include fusible base 188 with non-fusible stem or post 190. Base 188 can be Sn, eutectic Sn/Pb, lead-free solder, binary alloys such as Sn—Pb, Sn—Bi, Sn—Cu, Sn—Ag, and Sn—Sb, ternary alloys such as Sn—Ag—Cu, and other suitable fusible material. Post 190 can be Au, Cu, alloys of Au or Cu, or other non-fusible conductive material. The width of base 188 is greater than a width of conductive layer 182. Base 188 is positioned over conductive layer 182 and reflowed to cover the top and side surfaces of conductive layer 182 as a bond-on-trace (BOT) connection.

After bonding base 188 to conductive layer 182, distal end 192 of post 190 is cut to the desired length for stud bumps 186. In one embodiment, stud bumps 186 have a height of 30-60 μm. In addition, distal end 192 can be flattened or coined by mechanical pressure or other suitable process. Distal end 192 of posts 190 can be individually flattened one-by-one, or posts 190 can be collectively flattened by pressing a plate with a flat surface against the wires simultaneously. The flattened distal end 192 provides a uniform stud bump height. Stud bumps 186 provide a non-fusible, reliable, and fixed vertical interconnect structure.

Figure 7C:
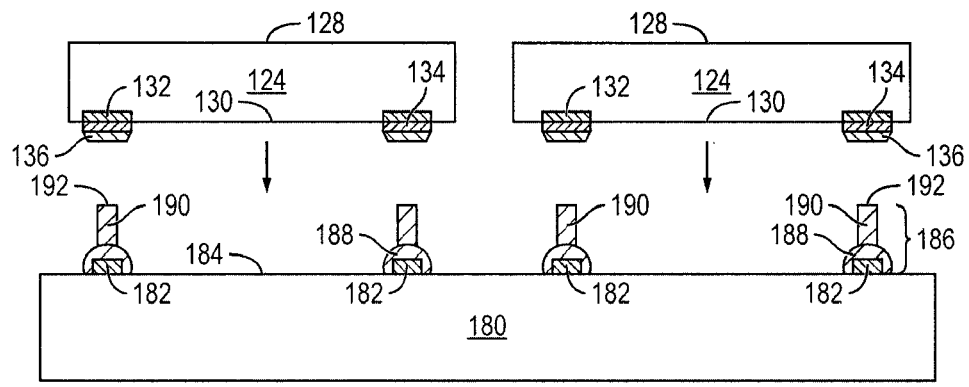
Figure 7D:
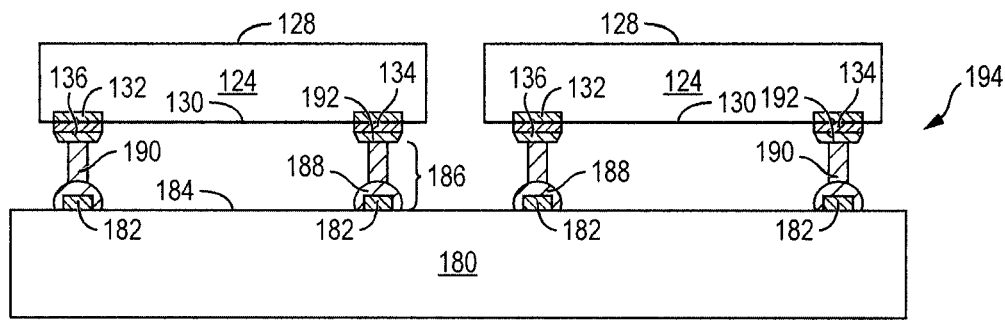
Figure 7E:
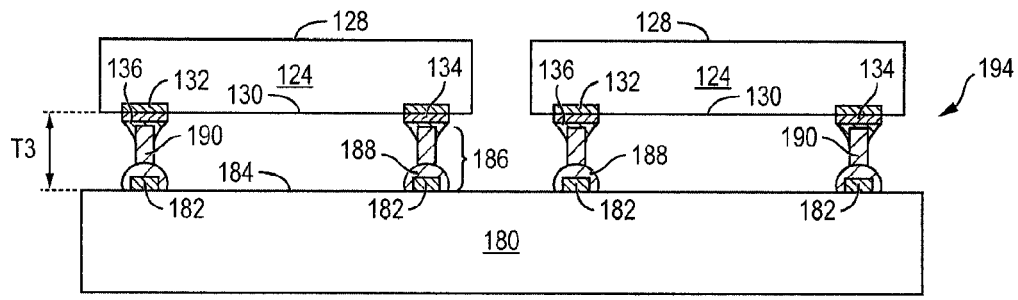

FIG. 7c shows semiconductor die 124 from FIG. 4e positioned over substrate 180 using a pick and place operation with active surface 130 oriented toward the substrate and fusible layer 136 aligned with stud bumps 186. In FIG. 7d, semiconductor die 124 is brought into proximity of substrate 180 with fusible layer 136 contacting distal end 192 of post 190. Fusible layer 136 is reflowed to metallurgically and electrically connect the fusible layer with the respective stud bumps 186. Alternatively, fusible layer 136 is metallurgically and electrically connected to the respective stud bumps 186 by thermal compression bonding, e.g., 30 MPa of pressure at 300° C. for 2 minutes. FIG. 7e shows semiconductor die 124 mounted to substrate 180 with fusible layer 136 bonded to respective stud bumps 186. Fusible layer 136 coalesces around distal end 192 of posts 190. The multiple semiconductor 124 mounted to substrate 180 constitute a reconstituted semiconductor wafer 194.

Figure 7F:
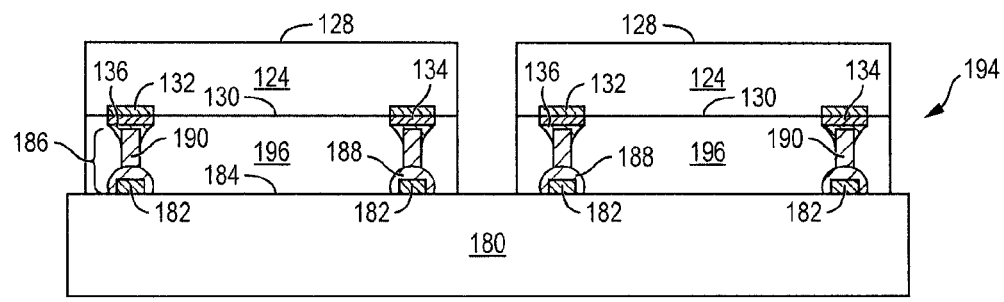

The non-fusible nature of stud bumps 186 creates a fixed offset T3 between semiconductor die 124 and substrate 180. In one embodiment, the fixed offset T3 is 30-60 μm. An underfill material 196, such as epoxy resin, is deposited between semiconductor die 124 and substrate 180 by needle dispensing along one or more edges of the semiconductor die, as shown in FIG. 7f. The surfaces of semiconductor die 124 and substrate 180 can be cleaned prior to depositing underfill material 196. The underfill material 196 is drawn into the space between semiconductor die 124 and substrate 180 by capillary action. Alternatively, underfill material 196 is injected between semiconductor die 124 and substrate 180 with vacuum assist. The underfill material 196 is cured with heat. The underfill material 196 protects stud bumps 186 from moisture and environmental contaminants and provides mechanical support for the assembly. In addition, underfill material 196 compensates for thermal expansion differences between semiconductor die 124 and substrate 180. Any differences in thermal expansion between semiconductor die 124 and substrate 180 is distributed across underfill material 196 to relieve stress on stud bumps 186.

Figure 7G:
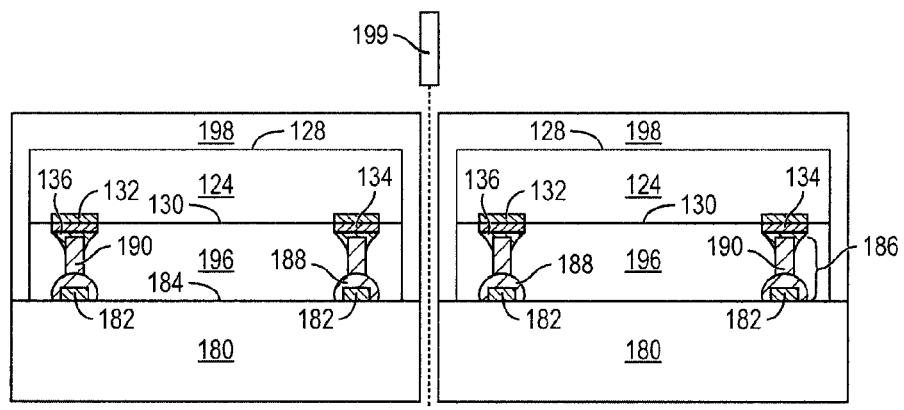

In FIG. 7g, an encapsulant or molding compound 198 is deposited over semiconductor die 124 and substrate 180 using a paste printing, compressive molding, transfer molding, liquid encapsulant molding, vacuum lamination, spin coating, or other suitable applicator. Encapsulant 198 can be polymer composite material, such as epoxy resin with filler, epoxy acrylate with filler, or polymer with proper filler. The viscosity of encapsulant 198 is selected for uniform coverage, e.g., a lower viscosity increases the flow of the encapsulant. Encapsulant 198 is non-conductive and environmentally protects the semiconductor device from external contaminants.

The reconstituted wafer 194 is singulated through encapsulant 198 and substrate 180 using saw blade or laser cutting tool 199.

The vertical interconnect structure between semiconductor die 124 and substrate 180, including conductive layers 132 and 182, fusible layer 136, and stud bumps 186, provide a fine pitch for a high I/O count application. The vertical offset T3 provides vertical standoff for ready application of underfill material 196. The interconnect structure can be formed on active surface 130, or in a peripheral region around semiconductor die 124. Fusible layer 136 and stud bumps 186 can be lead-free to eliminate a potential source of contamination.

The vertical interconnect structure is suitable for partial wafer fabrication and partial die assembly. Substrate 180 with conductive layer 182 and stud bumps 186 can be formed in a die assembly facility. Semiconductor wafer 120 with conductive layers 132-134 and fusible layer 136 are formed at wafer fabrication and then singulated and mounted to substrate 180 at the die assembly facility to increase throughput and lower costs.

Figure 8A:
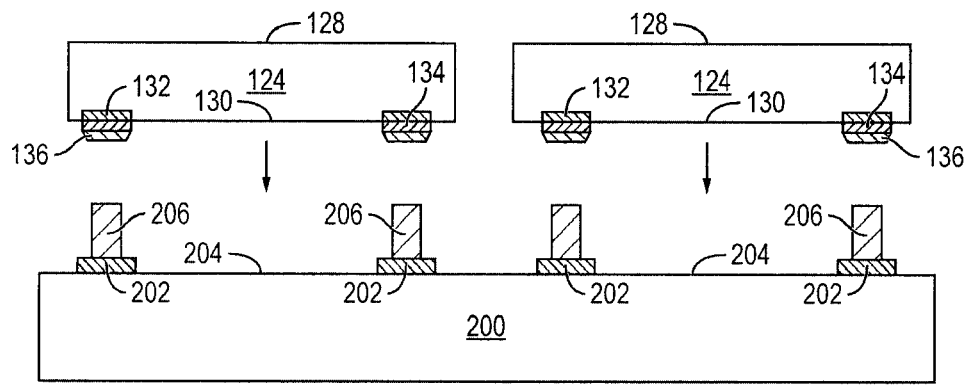
FIGS. 8a-8e illustrate a process of forming non-fusible conductive columns over a substrate and mounting a semiconductor die to the substrate.

FIGS. 8a-8e illustrate an embodiment of forming non-fusible conductive columns over a substrate and mounting a semiconductor die to the substrate. FIG. 8a shows substrate 200 with an electrically conductive layer 202 formed over surface 204 using electrolytic plating, electroless plating process, or other suitable metal deposition process. Substrate 200 can be a carrier, leadframe, PCB, or other supporting structure. Conductive layer 202 can be one or more layers of Al, Cu, Sn, Ni, Au, Ag, or other suitable electrically conductive material. Conductive layer 202 operates as bond pads formed at locations on substrate 200 corresponding to fusible layer 136 of semiconductor die 124.

Figure 8B:
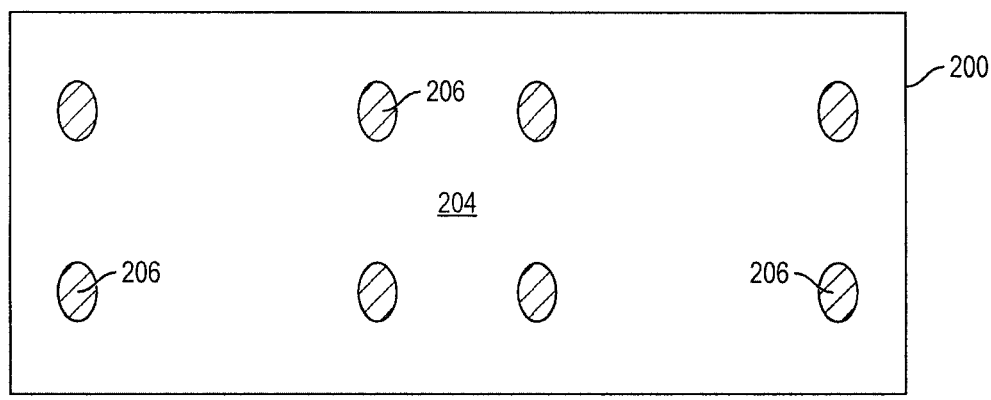
Figure 8C:
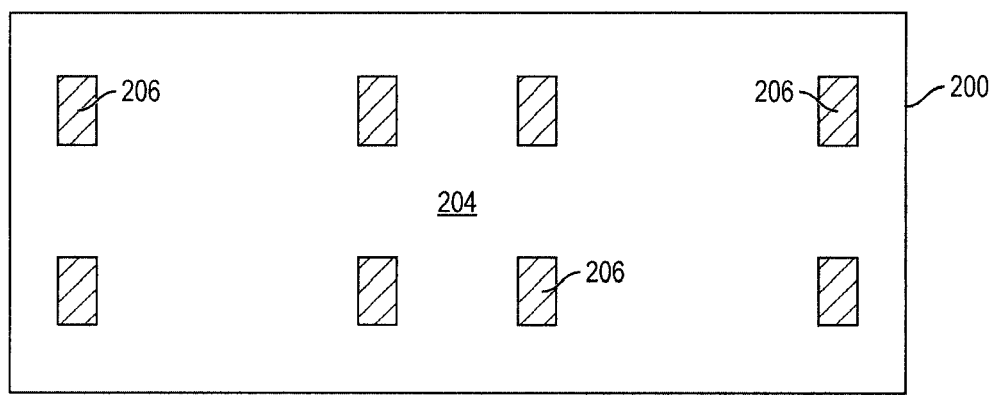

A plurality of conductive columns or pillars 206 is formed over conductive layer 202 as a vertical interconnect structure. Conductive columns 206 can be formed by depositing a photoresist layer over substrate 200. A plurality of vias is formed through the photoresist layer by an etching process to expose conductive layer 202. The vias are filled with Al, Cu, Ni, Au, Ag, alloys thereof, or other non-fusible conductive material. The photoresist layer is removed leaving conductive columns 206 with a height of 30-60 μm. FIG. 8b shows a plan view of conductive columns 206 with an oval cross-section for greater interconnect surface area. FIG. 8c shows a plan view of conductive columns 206 with a rectangular cross-section for greater interconnect surface area. Conductive columns 206 can also have a square or circular cross-sectional area.

Figure 8D:
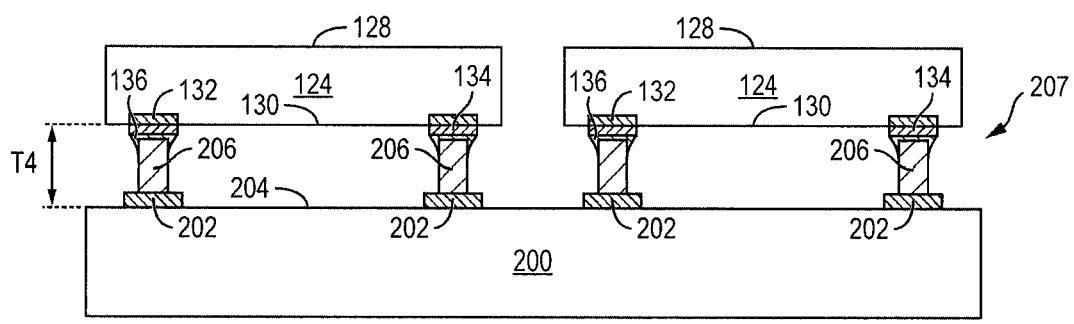

Semiconductor die 124 from FIG. 4e is positioned over substrate 200 using a pick and place operation with active surface 130 oriented toward the substrate and fusible layer 136 aligned with conductive columns 206. In FIG. 8d, semiconductor die 124 is brought into proximity of substrate 120 with fusible layer 136 contacting conductive columns 206. Fusible layer 136 is reflowed to metallurgically and electrically connect the fusible layer with the respective conductive columns 206. Alternatively, fusible layer 136 is metallurgically and electrically connected to the respective conductive columns 206 by thermal compression bonding, e.g., 30 MPa of pressure at 300° C. for 2 minutes. The multiple semiconductor 124 mounted to substrate 200 constitute a reconstituted semiconductor wafer 207. The non-fusible nature of conductive columns 206 creates a fixed offset T4 between semiconductor die 124 and substrate 200. In one embodiment, the fixed offset T4 is 30-60 μm.

Figure 8E:
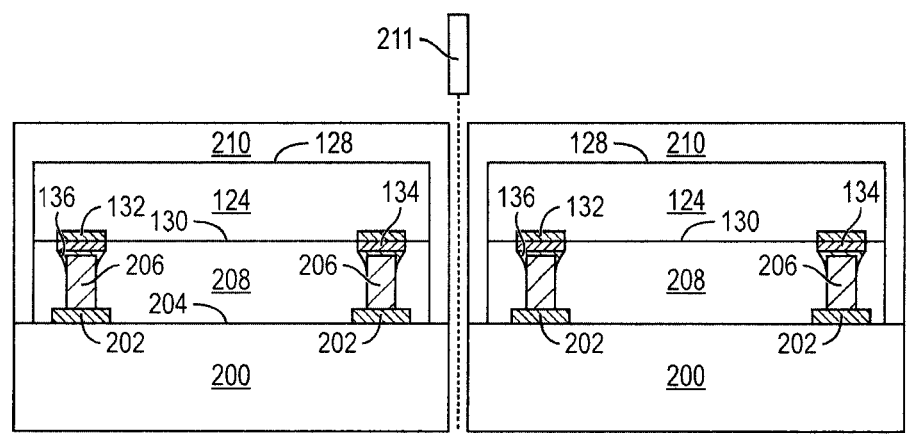

In FIG. 8e, an underfill material 208, such as epoxy resin, is deposited between semiconductor die 124 and substrate 200 by needle dispensing along one or more edges of the semiconductor die. The surfaces of semiconductor die 124 and substrate 200 can be cleaned prior to depositing underfill material 208. The underfill material 208 is drawn into the space between semiconductor die 124 and substrate 200 by capillary action. Alternatively, underfill material 208 is injected between semiconductor die 124 and substrate 200 with vacuum assist. The underfill material 208 is cured with heat. The underfill material 208 protects conductive columns 206 from moisture and environmental contaminants and provides mechanical support for the assembly. In addition, underfill material 208 compensates for thermal expansion differences between semiconductor die 124 and substrate 200. Any differences in thermal expansion between semiconductor die 124 and substrate 200 is distributed across underfill material 208 to relieve stress on conductive columns 206.

An encapsulant or molding compound 210 is deposited over semiconductor die 124 and substrate 200 using a paste printing, compressive molding, transfer molding, liquid encapsulant molding, vacuum lamination, spin coating, or other suitable applicator. Encapsulant 210 can be polymer composite material, such as epoxy resin with filler, epoxy acrylate with filler, or polymer with proper filler. The viscosity of encapsulant 210 is selected for uniform coverage, e.g., a lower viscosity increases the flow of the encapsulant. Encapsulant 210 is non-conductive and environmentally protects the semiconductor device from external contaminants.

The reconstituted wafer 207 is singulated through encapsulant 210 and substrate 200 using saw blade or laser cutting tool 211.

The vertical interconnect structure between semiconductor die 124 and substrate 200, including conductive layers 132 and 202, fusible layer 136, and conductive columns 206, provide a fine pitch for a high I/O count application. The vertical offset T4 provides vertical standoff for ready application of underfill material 208. The interconnect structure can be formed on active surface 130, or in a peripheral region around semiconductor die 124. Fusible layer 136 and conductive columns 206 can be lead-free to eliminate a potential source of contamination. The vertical interconnect structure is suitable for partial wafer fabrication and partial die assembly.

Figure 9A:
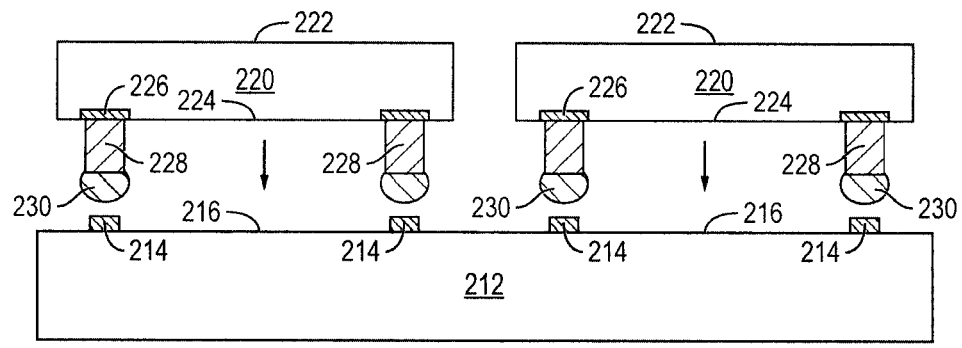
FIGS. 9a-9f illustrate a process of forming non-fusible stud bumps over a semiconductor die and mounting the semiconductor die to a substrate.

FIGS. 9a-9f illustrate an embodiment of forming non-fusible stud bumps over a semiconductor die and mounting the semiconductor die to a substrate. FIG. 9a shows substrate 212 with an electrically conductive layer 214 formed over surface 216 using electrolytic plating, electroless plating process, extrusion, or other suitable metal deposition process. Substrate 212 can be a carrier, leadframe, PCB, or other supporting structure. Conductive layer 214 can be one or more layers of Al, Cu, Sn, Ni, Au, Ag, or other suitable electrically conductive material. Conductive layer 214 operates as bond pads formed at locations on substrate 212.

Semiconductor die 220, similar to FIGS. 4a-4e, has a back surface 222 and active surface 224 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 224 to implement analog circuits or digital circuits, such as DSP, ASIC, memory, or other signal processing circuit. Semiconductor die 220 may also contain IPDs, such as inductors, capacitors, and resistors, for RF signal processing.

An electrically conductive layer 226 is formed over active surface 224 using PVD, CVD, electrolytic plating, electroless plating process, or other suitable metal deposition process. Conductive layer 226 can be one or more layers of Al, Cu, Sn, Ni, Au, Ag, or other suitable electrically conductive material. Conductive layer 226 operates as contact pads electrically connected to the circuits on active surface 224. An optional UBM layer can be formed over conductive layer 226.

Figure 9B:
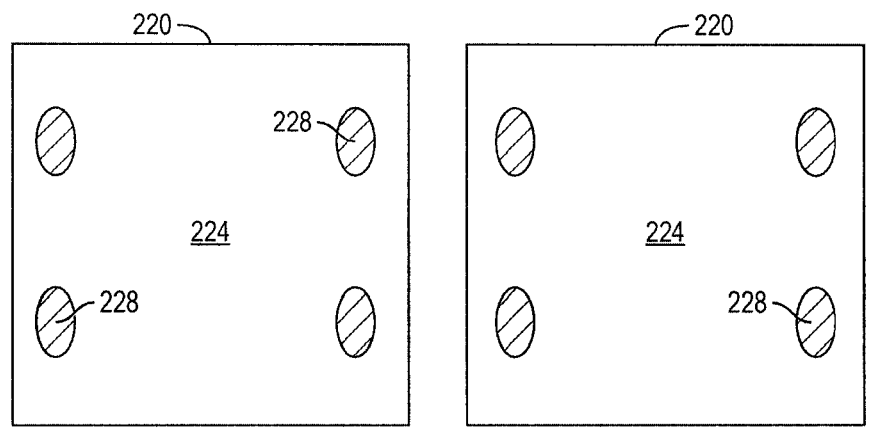
Figure 9C:
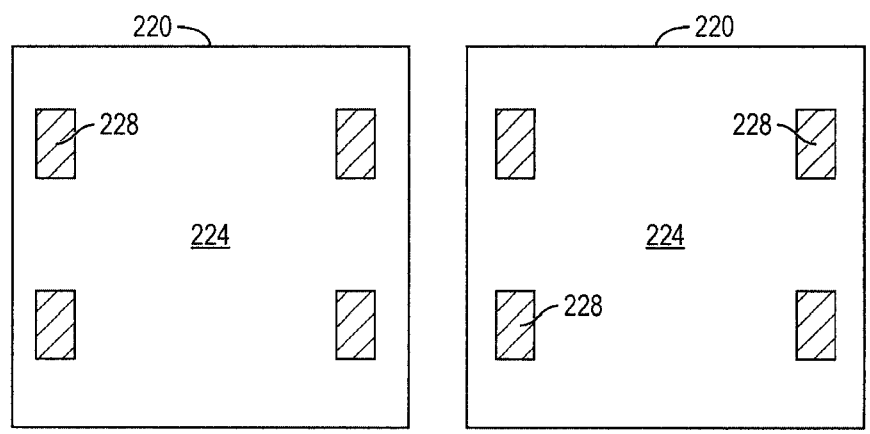

A plurality of conductive columns or pillars 228 is formed over conductive layer 226 as a vertical interconnect structure. Conductive columns 228 can be formed by depositing a photoresist layer over semiconductor die 220. A plurality of vias is formed through the photoresist layer by an etching process to expose conductive layer 224. The vias are filled with Al, Cu, Ni, Au, Ag, alloys thereof, or other non-fusible conductive material. The photoresist layer is removed leaving conductive columns 228 with a height of 30-60 μm. FIG. 9b shows a plan view of conductive columns 228 with an oval cross-section for greater interconnect surface area. FIG. 9c shows a plan view of conductive columns 228 with a rectangular cross-section for greater interconnect surface area. Conductive columns 228 can also have a square or circular cross-sectional area.

Fusible caps 230 are formed over conductive columns 228. Fusible caps 230 can be Sn, eutectic Sn/Pb, lead-free solder, binary alloys such as Sn—Pb, Sn—Bi, Sn—Cu, Sn—Ag, and Sn—Sb, ternary alloys such as Sn—Ag—Cu, and other suitable fusible material.

Figure 9D:
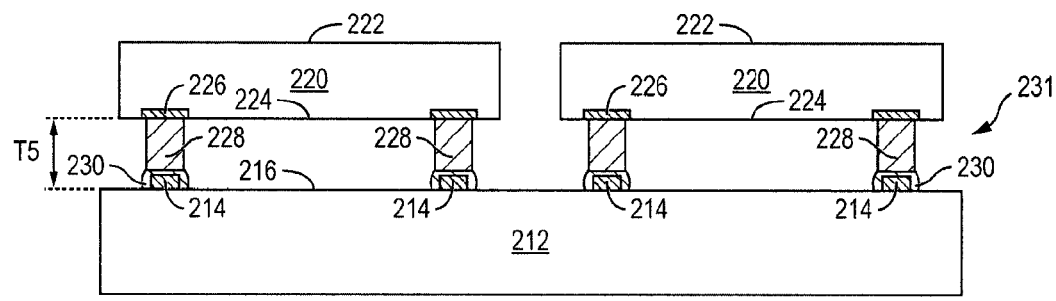
Figure 9E:
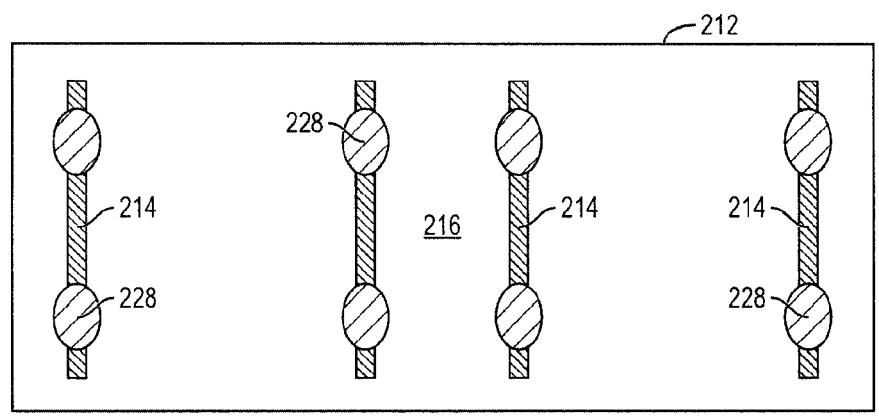

Semiconductor die 220 is positioned over substrate 212 using a pick and place operation with active surface 224 oriented toward the substrate and conductive columns 228 aligned with conductive layer 214. In FIG. 9d, semiconductor die 220 is brought into proximity of substrate 212 with fusible caps 230 contacting conductive layer 214. Fusible caps 230 are reflowed to metallurgically and electrically connect conductive columns 228 to conductive layer 214. The width of conductive columns 228 is greater than a width of conductive layer 214 with fusible cap 230 covering the top and side surfaces of conductive layer 214 as a BOT connection. Alternatively, conductive columns 228 are metallurgically and electrically connected to conductive layer 214 by thermal compression bonding, e.g., 30 MPa of pressure at 300° C. for 2 minutes. The multiple semiconductor 220 mounted to substrate 212 constitute a reconstituted semiconductor wafer 231. The non-fusible nature of conductive columns 228 creates a fixed offset T5 between semiconductor die 220 and substrate 212. In one embodiment, the fixed offset T5 is 30-60 µm. FIG. 9e shows a plan view of conductive columns 228 bonded to conductive layer 214 as a BOT connection.

Figure 9F:
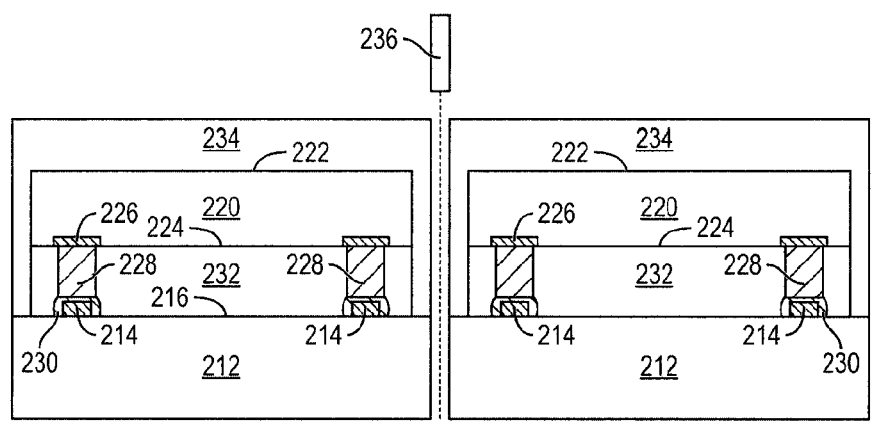

In FIG. 9f, an underfill material 232, such as epoxy resin, is deposited between semiconductor die 220 and substrate 212 by needle dispensing along one or more edges of the semiconductor die. The surfaces of semiconductor die 220 and substrate 212 can be cleaned prior to depositing underfill material 232. The underfill material 232 is drawn into the space between semiconductor die 220 and substrate 212 by capillary action. Alternatively, underfill material 232 is injected between semiconductor die 220 and substrate 212 with vacuum assist. The underfill material 232 is cured with heat. The underfill material 232 protects conductive columns 228 from moisture and environmental contaminants and provides mechanical support for the assembly. In addition, underfill material 232 compensates for thermal expansion differences between semiconductor die 220 and substrate 212. Any differences in thermal expansion between semiconductor die 220 and substrate 212 is distributed across underfill material 232 to relieve stress on conductive columns 228.

An encapsulant or molding compound 234 is deposited over semiconductor die 220 and substrate 212 using a paste printing, compressive molding, transfer molding, liquid encapsulant molding, vacuum lamination, spin coating, or other suitable applicator. Encapsulant 234 can be polymer composite material, such as epoxy resin with filler, epoxy acrylate with filler, or polymer with proper filler. The viscosity of encapsulant 234 is selected for uniform coverage, e.g., a lower viscosity increases the flow of the encapsulant. Encapsulant 234 is non-conductive and environmentally protects the semiconductor device from external contaminants.

The reconstituted wafer 231 is singulated through encapsulant 234 and substrate 212 using saw blade or laser cutting tool 236.

The vertical interconnect structure between semiconductor die 220 and substrate 212, including conductive layers 226 and 214 and conductive columns 228, provide a fine pitch for a high I/O count application. The offset T5 provides vertical standoff for ready application of underfill material 232. The vertical interconnect structure can be formed on active surface 224, or in a peripheral region around semiconductor die 220. The vertical interconnect structure is suitable for partial wafer fabrication and partial die assembly.

Figure 10A:
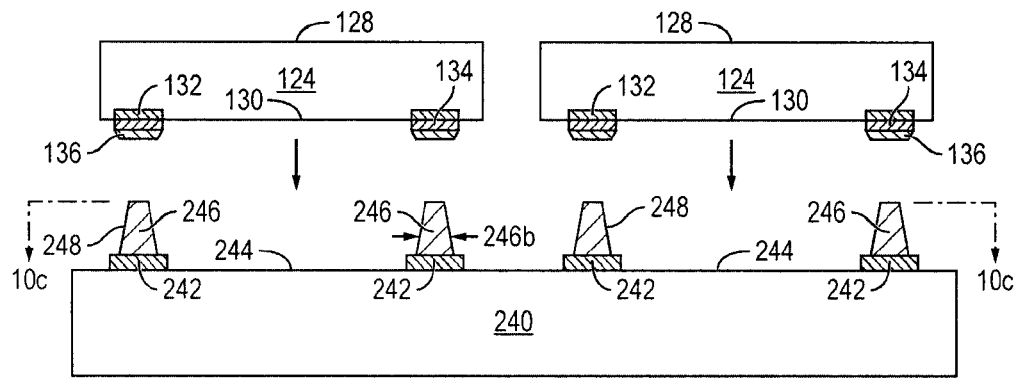
FIGS. 10a-10e illustrate a process of forming non-fusible tapered bumps over a substrate and mounting a semiconductor die to the substrate.

FIGS. 10a-10e illustrate an embodiment of forming non-fusible tapered bumps over a substrate and mounting a semiconductor die to the substrate. FIG. 10a shows substrate 240 with an electrically conductive layer 242 formed over surface 244 using electrolytic plating, electroless plating process, or other suitable metal deposition process. Substrate 240 can be a carrier, leadframe, PCB, or other supporting structure. Conductive layer 242 can be one or more layers of Al, Cu, Sn, Ni, Au, Ag, or other suitable electrically conductive material. Conductive layer 242 operates as bond pads formed at locations on substrate 240 corresponding to fusible layer 136 of semiconductor die 124.

Figure 10B:
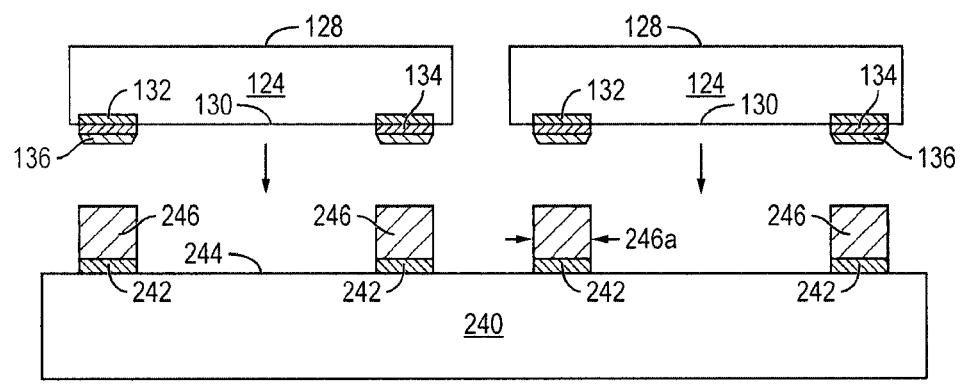
Figure 10C:
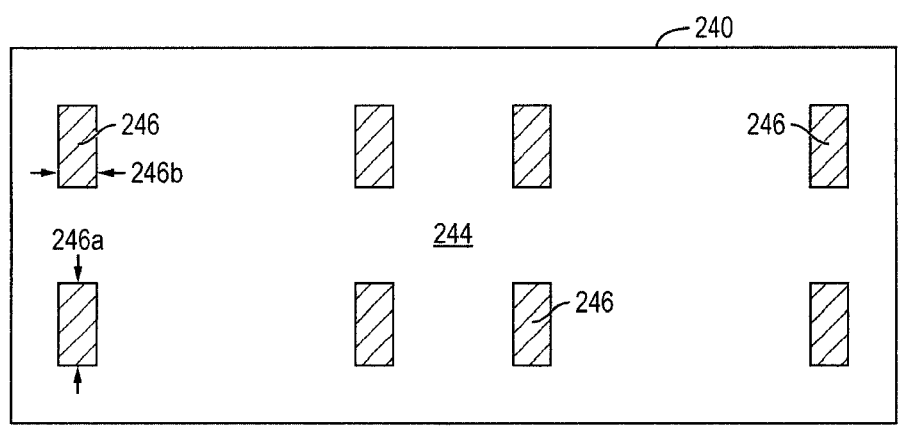

A plurality of high profile conductive bumps 246 is formed over conductive layer 242 as a vertical interconnect structure. Conductive bumps 246 have tapered sidewalls 248 and a length 246a greater than a width 246b of the bump. Conductive bumps 246 can be formed by depositing a photoresist layer over substrate 240. A plurality of vias is formed through the photoresist layer by an etching process to expose conductive layer 242. The vias have tapered sidewalls and a length greater than a width of the via. The vias are filled with Al, Cu, Ni, Au, Ag, alloys thereof, or other non-fusible conductive material. The photoresist layer is removed leaving tapered conductive bumps 246 with a height of 30-60 µm. FIG. 10b shows a cross-sectional view of conductive bumps 246 perpendicular to FIG. 10a, showing the length 246a of conductive bumps 246 greater than the width 246b of the conductive bumps. FIG. 10c shows a plan view of conductive bumps 246 taken along line 10c-10c of FIG. 10a with length 246a greater than width 246b of the bump. Conductive bumps 246 can also have an oval cross-sectional area.

Figure 10D:
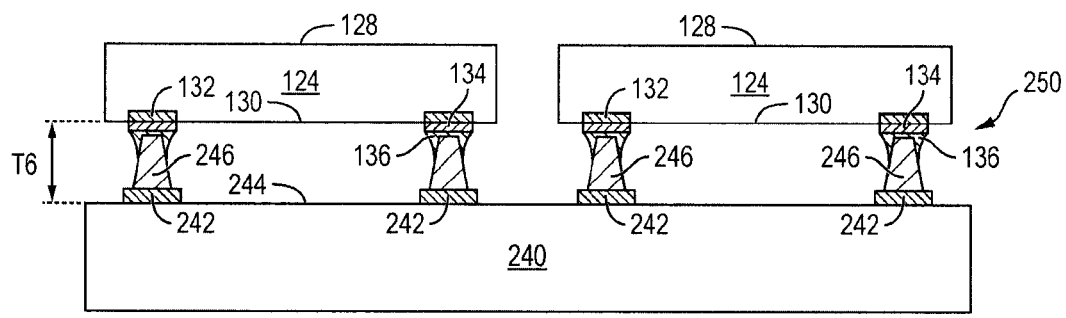

Semiconductor die 124 from FIG. 4e is positioned over substrate 240 using a pick and place operation with active surface 130 oriented toward the substrate and fusible layer 136 aligned with conductive bumps 246. In FIG. 10d, semiconductor die 124 is brought into proximity of substrate 120 with fusible layer 136 contacting conductive bumps 246. Fusible layer 136 is reflowed to metallurgically and electrically connect the fusible layer with the respective conductive bumps 246. Alternatively, fusible layer 136 is metallurgically and electrically connected to the respective conductive bumps 246 by thermal compression bonding, e.g., 30 MPa of pressure at 300° C. for 2 minutes. The multiple semiconductor 124 mounted to substrate 240 constitute a reconstituted semiconductor wafer 250. The non-fusible nature of conductive bumps 246 creates a fixed offset T6 between semiconductor die 124 and substrate 240. In one embodiment, the fixed offset T6 is 30-60 µm.

Figure 10E:
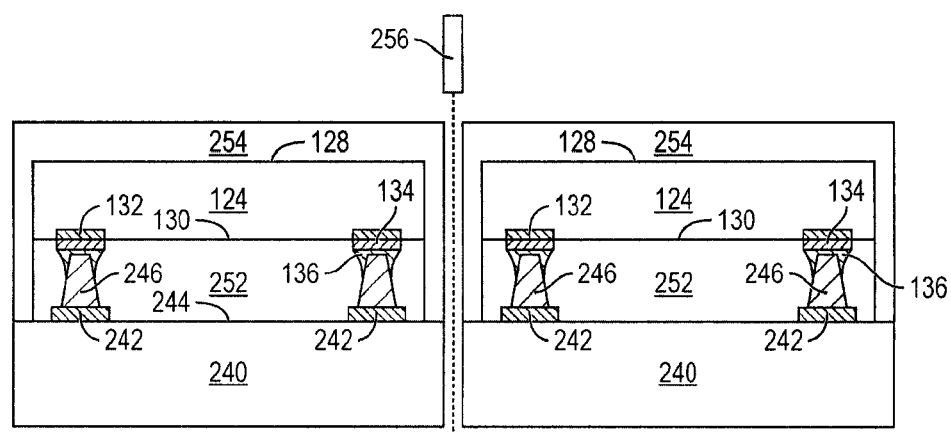

In FIG. 10e, an underfill material 252, such as epoxy resin, is deposited between semiconductor die 124 and substrate 240 by needle dispensing along one or more edges of the semiconductor die. The surfaces of semiconductor die 124 and substrate 240 can be cleaned prior to depositing underfill material 252. The underfill material 252 is drawn into the space between semiconductor die 124 and substrate 240 by capillary action. Alternatively, underfill material 252 is injected between semiconductor die 124 and substrate 240 with vacuum assist. The underfill material 252 is cured with heat. The underfill material 252 protects conductive bumps 246 from moisture and environmental contaminants and provides mechanical support for the assembly. In addition, underfill material 252 compensates for thermal expansion differences between semiconductor die 124 and substrate 240. Any differences in thermal expansion between semiconductor die 124 and substrate 240 is distributed across underfill material 252 to relieve stress on conductive bumps 246.

An encapsulant or molding compound 254 is deposited over semiconductor die 124 and substrate 240 using a paste printing, compressive molding, transfer molding, liquid encapsulant molding, vacuum lamination, spin coating, or other suitable applicator. Encapsulant 254 can be polymer composite material, such as epoxy resin with filler, epoxy acrylate with filler, or polymer with proper filler. The viscosity of encapsulant 254 is selected for uniform coverage, e.g., a lower viscosity increases the flow of the encapsulant. Encapsulant 254 is non-conductive and environmentally protects the semiconductor device from external contaminants.

The reconstituted wafer 250 is singulated through encapsulant 254 and substrate 240 using saw blade or laser cutting tool 256.

The vertical interconnect structure between semiconductor die 124 and substrate 240, including conductive layers 132 and 242, fusible layer 136, and conductive bumps 246, provide a fine pitch for a high I/O count application. The offset T6 provides vertical standoff for ready application of underfill material 252. The vertical interconnect structure can be formed on active surface 130, or in a peripheral region around semiconductor die 124. Fusible layer 136 and conductive bumps 246 can be lead-free to eliminate a potential source of contamination. The vertical interconnect structure is suitable for partial wafer fabrication and partial die assembly.

Figure 11A:
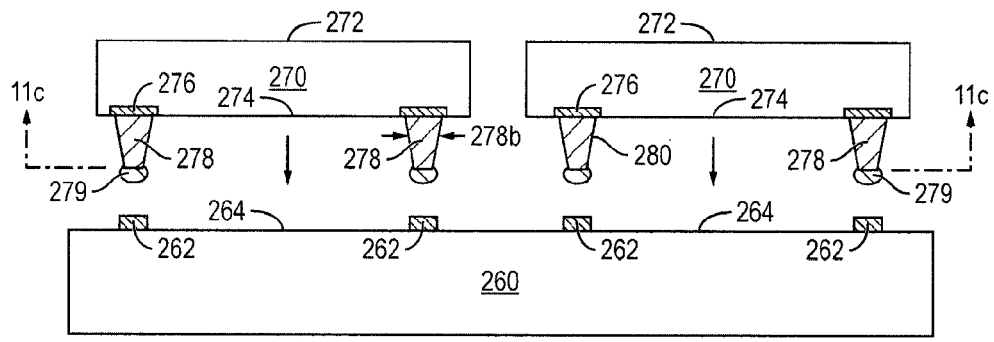
FIGS. 11a-11f illustrate a process of forming non-fusible tapered bumps over a semiconductor die and mounting the semiconductor die to a substrate.

FIGS. 11a-11f illustrate an embodiment of forming non-fusible tapered bumps over a semiconductor die and mounting the semiconductor die to a substrate. FIG. 11a shows substrate 260 with an electrically conductive layer 262 formed over surface 264 using electrolytic plating, electroless plating process, extrusion, or other suitable metal deposition process. Substrate 260 can be a carrier, leadframe, PCB, or other supporting structure. Conductive layer 262 can be one or more layers of Al, Cu, Sn, Ni, Au, Ag, or other suitable electrically conductive material. Conductive layer 262 operates as bond pads formed at locations on substrate 260.

Semiconductor die 270, similar to FIGS. 4a-4e, has a back surface 272 and active surface 274 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 274 to implement analog circuits or digital circuits, such as DSP, ASIC, memory, or other signal processing circuit. Semiconductor die 270 may also contain IPDs, such as inductors, capacitors, and resistors, for RF signal processing.

An electrically conductive layer 276 is formed over active surface 274 using PVD, CVD, electrolytic plating, electroless plating process, or other suitable metal deposition process. Conductive layer 276 can be one or more layers of Al, Cu, Sn, Ni, Au, Ag, or other suitable electrically conductive material. Conductive layer 276 operates as contact pads electrically connected to the circuits on active surface 274. An optional UBM layer can be formed over conductive layer 276.

Figure 11B:
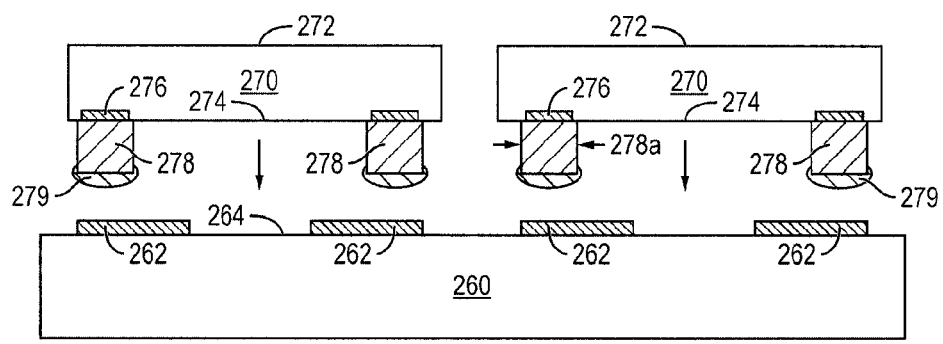
Figure 11C:
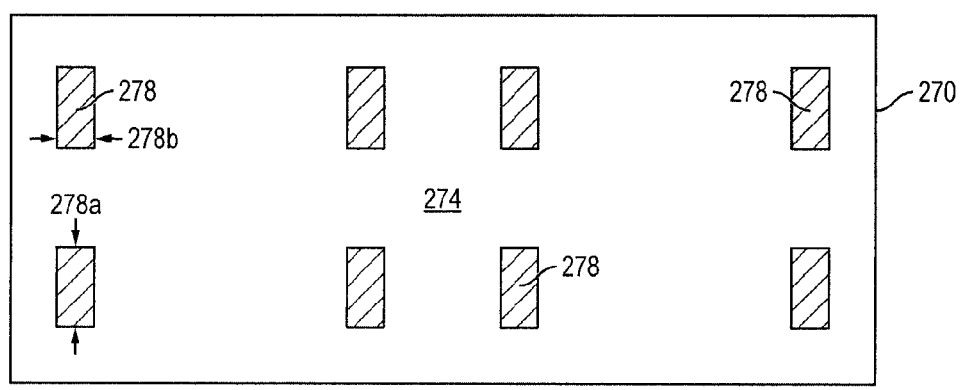

A plurality of conductive bumps 278 is formed over conductive layer 276 as a vertical interconnect structure. Conductive bumps 278 have tapered sidewalls 282 and a length 278a greater than a width 278b of the bump. Conductive bumps 278 can be formed by depositing a photoresist layer over semiconductor die 270. A plurality of vias is formed through the photoresist layer by an etching process to expose conductive layer 276. The vias have tapered sidewalls and a length greater than a width of the via. The vias are filled with Al, Cu, Ni, Au, Ag, alloys thereof, or other non-fusible conductive material. The photoresist layer is removed leaving tapered conductive bumps 278 with a height of 30-60 µm. FIG. 11b shows a cross-sectional view of conductive bumps 278 perpendicular to FIG. 11a. FIG. 11c shows a plan view of conductive bumps 278 taken along line 11c-11c of FIG. 11a with length 278a greater than width 278b of the bump. Conductive bumps 278 can also have a square, oval, or circular cross-sectional area.

Fusible caps 279 are formed over conductive bumps 278. Fusible caps 279 can be Sn, eutectic Sn/Pb, lead-free solder, binary alloys such as Sn—Pb, Sn—Bi, Sn—Cu, Sn—Ag, and Sn—Sb, ternary alloys such as Sn—Ag—Cu, and other suitable fusible material.

Figure 11D:
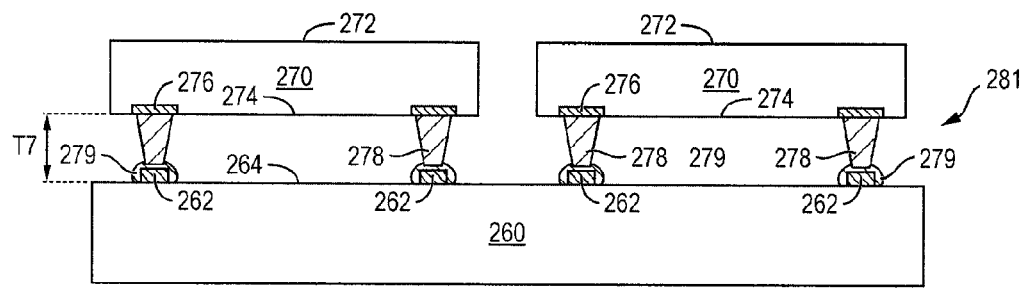
Figure 11E:
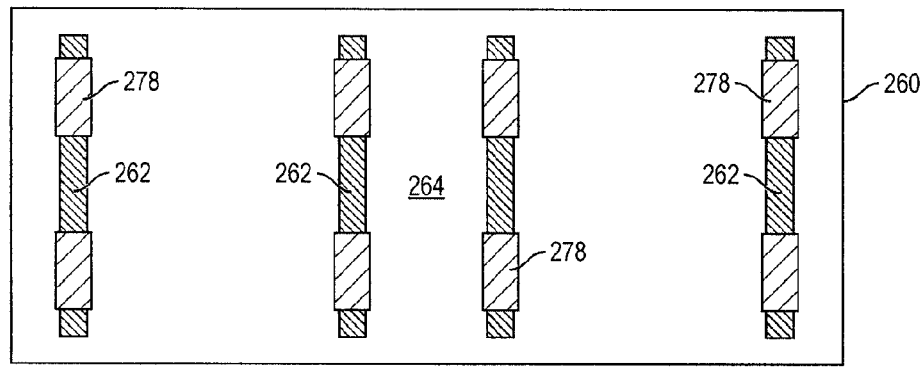

Semiconductor die 270 is positioned over substrate 260 using a pick and place operation with active surface 274 oriented toward the substrate and conductive bumps 278 aligned with conductive layer 262. In FIG. 11d, semiconductor die 270 is brought into proximity of substrate 260 with fusible caps 279 contacting conductive layer 262. Fusible caps 279 are reflowed to metallurgically and electrically connect conductive bumps 278 to conductive layer 262. The width of conductive bumps 278 is greater than a width of conductive layer 262 with fusible cap 279 covering the top and side surfaces of conductive layer 262 as a BOT connection. Alternatively, conductive bumps 278 are metallurgically and electrically connected to conductive layer 262 by thermal compression bonding, e.g., 30 MPa of pressure at 300° C. for 2 minutes. The multiple semiconductor 270 mounted to substrate 260 constitute a reconstituted semiconductor wafer 281. The non-fusible nature of conductive bumps 278 creates a fixed offset T7 between semiconductor die 270 and substrate 260. In one embodiment, the fixed offset T7 is 30-60 µm. FIG. 11e shows a plan view of conductive bumps 278 bonded to conductive layer 262 as a BOT connection.

Figure 11F:
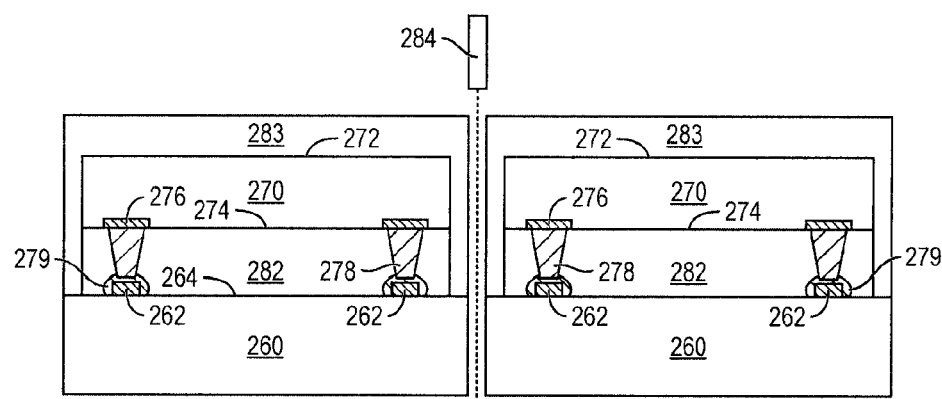

In FIG. 11f, an underfill material 282, such as epoxy resin, is deposited between semiconductor die 270 and substrate 260 by needle dispensing along one or more edges of the semiconductor die. The surfaces of semiconductor die 270 and substrate 260 can be cleaned prior to depositing underfill material 282. The underfill material 282 is drawn into the space between semiconductor die 270 and substrate 260 by capillary action. Alternatively, underfill material 282 is injected between semiconductor die 270 and substrate 260 with vacuum assist. The underfill material 282 is cured with heat. The underfill material 282 protects conductive bumps 278 from moisture and environmental contaminants and provides mechanical support for the assembly. In addition, underfill material 282 compensates for thermal expansion differences between semiconductor die 270 and substrate 260. Any differences in thermal expansion between semiconductor die 270 and substrate 260 is distributed across underfill material 282 to relieve stress on conductive bumps 278.

An encapsulant or molding compound 283 is deposited over semiconductor die 270 and substrate 260 using a paste printing, compressive molding, transfer molding, liquid encapsulant molding, vacuum lamination, spin coating, or other suitable applicator. Encapsulant 283 can be polymer composite material, such as epoxy resin with filler, epoxy acrylate with filler, or polymer with proper filler. The viscosity of encapsulant 283 is selected for uniform coverage, e.g., a lower viscosity increases the flow of the encapsulant. Encapsulant 283 is non-conductive and environmentally protects the semiconductor device from external contaminants.

The reconstituted wafer 281 is singulated through encapsulant 283 and substrate 260 using saw blade or laser cutting tool 284.

The vertical interconnect structure between semiconductor die 270 and substrate 260, including conductive layers 276 and 262 and conductive bumps 278, provide a fine pitch for a high I/O count application. The offset T7 provides vertical standoff for ready application of underfill material 282. The vertical interconnect structure can be formed on active surface 274, or in a peripheral region around semiconductor die 270. The vertical interconnect structure is suitable for partial wafer fabrication and partial die assembly.

Figure 12A:
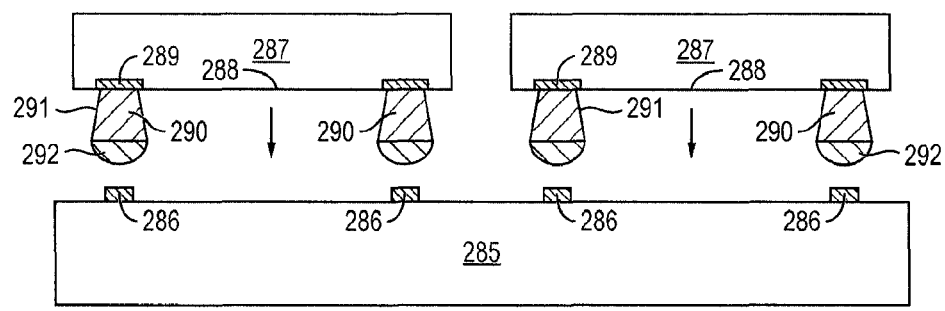
FIGS. 12a-12d illustrate a process of forming non-fusible tapered conductive columns over a semiconductor die and mounting the semiconductor die to a substrate.

FIGS. 12a-12d illustrate an embodiment of forming non-fusible tapered conductive columns over a semiconductor die and mounting the semiconductor die to a substrate. FIG. 12a shows substrate 285 with an electrically conductive layer 286 formed over a surface of the substrate using electrolytic plating, electroless plating process, extrusion, or other suitable metal deposition process. Substrate 285 can be a carrier, leadframe, PCB, or other supporting structure. Conductive layer 286 can be one or more layers of Al, Cu, Sn, Ni, Au, Ag, or other suitable electrically conductive material. Conductive layer 286 operates as bond pads formed at locations on substrate 285.

Semiconductor die 287, similar to FIGS. 4a-4e, has an active surface 288 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 288 to implement analog circuits or digital circuits, such as DSP, ASIC, memory, or other signal processing circuit. Semiconductor die 287 may also contain IPDs, such as inductors, capacitors, and resistors, for RF signal processing.

An electrically conductive layer 289 is formed over active surface 288 using PVD, CVD, electrolytic plating, electroless plating process, or other suitable metal deposition process. Conductive layer 289 can be one or more layers of Al, Cu, Sn, Ni, Au, Ag, or other suitable electrically conductive material. Conductive layer 289 operates as contact pads electrically connected to the circuits on active surface 288. An optional UBM layer can be formed over conductive layer 289.

A plurality of high profile conductive columns or posts 290 is formed over conductive layer 289 as a vertical interconnect structure. Conductive columns 290 have tapered sidewalls 291 and a length 290a greater than a width 290b of the bump. Conductive columns 290 can be formed by depositing a photoresist layer over semiconductor die 287. A plurality of vias is formed through the photoresist layer by an etching process to expose conductive layer 289. The vias have tapered sidewalls and a length greater than a width of the via. The vias are filled with Al, Cu, Ni, Au, Ag, alloys thereof, or other non-fusible conductive material. The photoresist layer is removed leaving tapered conductive columns 290.

Conductive columns 290 have non-fusible column or post, and fusible cap or base 292. Fusible cap 292 can be Sn, eutectic Sn/Pb, lead-free solder, binary alloys such as Sn—Pb, Sn—Bi, Sn—Cu, Sn—Ag, and Sn—Sb, ternary alloys such as Sn—Ag—Cu, and other suitable fusible material. The column or post can be Au, Cu, alloys of Au or Cu, or other non-fusible conductive material. Conductive columns 290 can have a circular, oval, rectangular, or square cross-sectional area. In one embodiment, conductive columns 290 have a height of 30-60 μm.

Figure 12B:
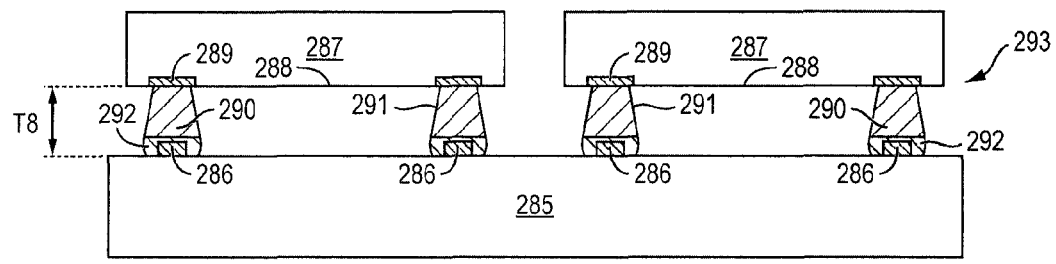

Semiconductor die 287 is positioned over substrate 285 using a pick and place operation with active surface 288 oriented toward the substrate and conductive columns 290 aligned with conductive layer 286. In FIG. 12b, semiconductor die 287 is brought into proximity of substrate 285 with fusible cap 292 contacting conductive layer 286. Fusible cap 292 is reflowed to metallurgically and electrically connect conductive columns 290 with the respective conductive layer 286. Alternatively, conductive columns 290 are metallurgically and electrically connected to the respective conductive layer 286 by thermal compression bonding, e.g., 30 MPa of pressure at 300° C. for 2 minutes. The width of conductive columns 290 is greater than a width of conductive layer 286. Fusible cap 292 covers the top and side surfaces of conductive layer 286 as a BOT connection. The multiple semiconductor 287 mounted to substrate 285 constitute a reconstituted semiconductor wafer 293. The non-fusible nature of conductive columns 290 creates a fixed offset T8 between semiconductor die 287 and substrate 285. In one embodiment, the fixed offset T8 is 30-60 μm.

Figure 12C:
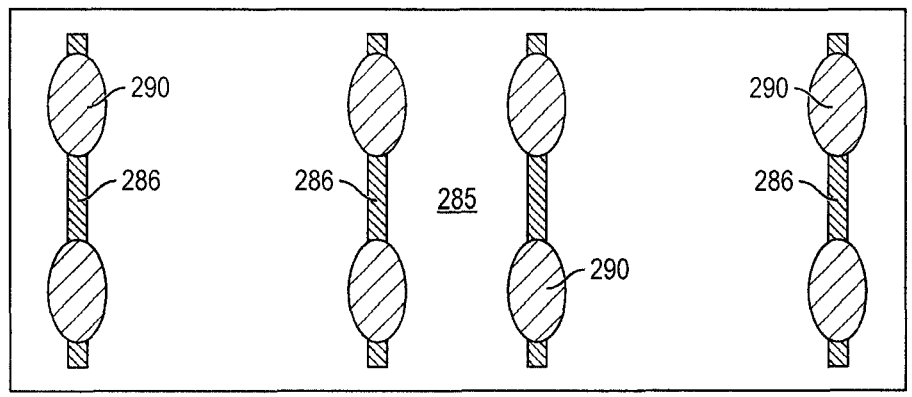

FIG. 12c shows conductive columns 290 metallurgically and electrically connected to the respective conductive layer 286. Conductive columns 290 are shown, for example, with an oval cross-sectional area.

Figure 12D:
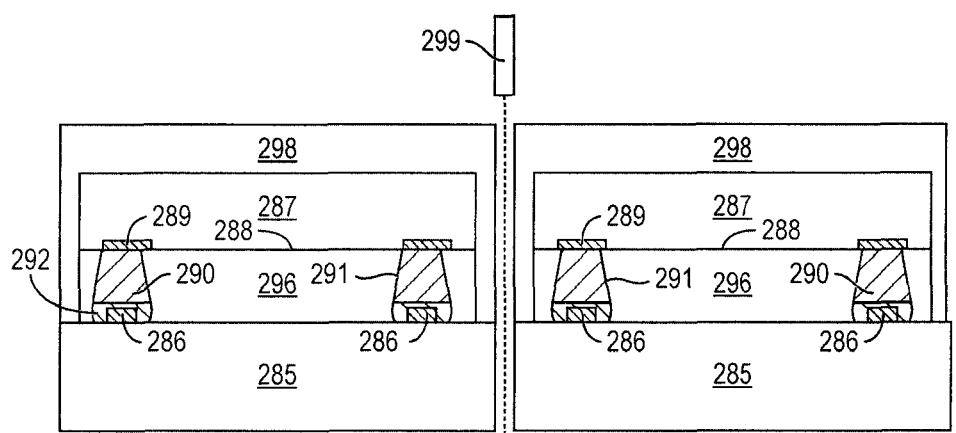

In FIG. 12d, an underfill material 296, such as epoxy resin, is deposited between semiconductor die 287 and substrate 285 by needle dispensing along one or more edges of the semiconductor die. The surfaces of semiconductor die 287 and substrate 285 can be cleaned prior to depositing underfill material 296. The underfill material 296 is drawn into the space between semiconductor die 287 and substrate 285 by capillary action. Alternatively, underfill material 298 is injected between semiconductor die 287 and substrate 285 with vacuum assist. The underfill material 296 is cured with heat. The underfill material 296 protects conductive columns 290 from moisture and environmental contaminants and provides mechanical support for the assembly. In addition, underfill material 296 compensates for thermal expansion differences between semiconductor die 287 and substrate 285. Any differences in thermal expansion between semiconductor die 287 and substrate 285 is distributed across underfill material 296 to relieve stress on conductive columns 290.

An encapsulant or molding compound 298 is deposited over semiconductor die 287 and substrate 285 using a paste printing, compressive molding, transfer molding, liquid encapsulant molding, vacuum lamination, spin coating, or other suitable applicator. Encapsulant 298 can be polymer composite material, such as epoxy resin with filler, epoxy acrylate with filler, or polymer with proper filler. The viscosity of encapsulant 298 is selected for uniform coverage, e.g., a lower viscosity increases the flow of the encapsulant. Encapsulant 298 is non-conductive and environmentally protects the semiconductor device from external contaminants.

The reconstituted wafer 293 is singulated through encapsulant 298 and substrate 285 using saw blade or laser cutting tool 299.

The vertical interconnect structure between semiconductor die 287 and substrate 285, including conductive layers 286 and 289 and conductive columns 290, provide a fine pitch for a high I/O count application. The offset T8 provides vertical standoff for ready application of underfill material 296. The vertical interconnect structure can be formed on active surface 288, or in a peripheral region around semiconductor die 287. The vertical interconnect structure is suitable for partial wafer fabrication and partial die assembly.

FIGS. 13a-13f illustrate a process of forming a flexible semiconductor wafer. FIG. 13a shows a semiconductor wafer 300 containing a base material, such as silicon, germanium, gallium arsenide, indium phosphide, or silicon carbide, in substrate 302 for structural support. A plurality of semiconductor die or components 304 is formed on wafer 300 separated by a non-active, inter-die wafer area or saw street 306 as described above. Saw street 306 provides cutting areas to singulate semiconductor wafer 300 into individual semiconductor die 304.

Each semiconductor die 304 has a back surface 308 and active surface 310 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements and electronic components formed within active surface 310 to implement analog circuits or digital circuits, such as DSP, ASIC, memory, or other signal processing circuit. Semiconductor die 304 may also contain IPDs, such as inductors, capacitors, and resistors, for RF signal processing.

An electrically conductive layer 312 is formed over active surface 310 using PVD, CVD, electrolytic plating, electroless plating process, or other suitable metal deposition process. Conductive layer 312 can be one or more layers of Al, Cu, Sn, Ni, Au, Ag, or other suitable electrically conductive material. Conductive layer 312 operates as contact pads electrically connected to the circuits on active surface 310.

An electrically conductive layer 314 is formed over conductive layer 312 using PVD, CVD, evaporation, sputtering, chemical plating, electrolytic plating, electroless plating, or other suitable metal deposition process. A mask can be used to define the location of conductive layer 314. In cases where conductive layer 312 is Al, any aluminum oxide is removed prior to forming conductive layer 314. The aluminum oxide can be removed by sputter etching, plasma etching, ion etching, or by wet etching. Conductive layer 314 can be one or more layers of Cr, Cu, Ti, Ni, V, W, Au, alloys thereof, or other suitable electrically conductive material. Conductive layer 314 operates as an UBM layer.

Conductive layer 314 can be formed with multiple layers including a gradient of compatibility materials. An adhesion layer is formed over conductive layer 312 for a strong, low-stress, low-resistance, mechanical and electrical connection to the underlying conductive layer. The adhesion layer can be Ti/Cr/Al with a thickness of 0.1 to 3 µm. A diffusion barrier layer is formed over the adhesion layer to inhibit diffusion of contaminants from the later formed fusible layer into active surface 310. The diffusion barrier layer has a thickness of 0.05 to 5 µm. A wettable layer is formed over the diffusion barrier layer for reliable bonding and adhesion to the fusible layer. The wettable layer has a thickness of 0.1 to 5 µm. An optional protective layer can be formed over portion of the wettable layer to protect the underlying material from oxidation and other environmental contaminants. The protective layer has a thickness of 0.05 to 3 µm. The overall thickness of conductive layer 136 is 0.1 to 5 µm.

In one embodiment, an adhesion layer of Ti/Cr/Al is formed over the exposed conductive layer 312 with thickness of 0.1 µm. A diffusion barrier layer of Cr:Cu is formed over the adhesion layer with a thickness of 0.08 µm. A wettable layer of Cu/Ni:V is formed over the diffusion-barrier layer with a thickness of 0.3 µm. A protective layer of Au is formed over the wettable layer with a thickness of 0.05 µm. In other cases, the multiple UBM layers can include Cr:Cr—Cu:Cu, Ti:Ni—V, Ti:Cu, Ti:W:Au, Ni:Au, Al/Ni/Cu, Al/NiV/Cu, and Ti:Cu:Ni.

An electrically conductive fusible layer 316 is formed over conductive layer 314 using screen-printing of conductive paste, plating, and other suitable metal deposition processes. Conductive layer 314 defines and limits the formation of fusible layer 316. Fusible layer 316 can be formed with the same mask used for conductive layer 314 to remove the need for a separate deposition step. Fusible layer 316 is bonded to conductive layer 314 using a suitable attachment or bonding process, including thermal compression bonding. Fusible layer 316 can be Sn, eutectic Sn/Pb, lead-free solder, binary alloys such as Sn—Pb, Sn—Bi, Sn—Cu, Sn—Ag, and Sn—Sb, ternary alloys such as Sn—Ag—Cu, and other suitable fusible materials. In one embodiment, fusible layer 316 has a thickness of 0.5 to 50 µm.

In some embodiments where fusible layer 316 does not pose a contamination concern for semiconductor die 304, conductive layer 314 can be formed with fewer layers or eliminated completely. Accordingly, conductive layer 312 and fusible layer 316 can be formed, with or without conductive layer 314, on semiconductor die 304 at the wafer level entirely in a wafer fabrication facility. In particular, conductive layers 312-314 and fusible layer 316 can be formed in the wafer fabrication facility using thin-film sputtering.

In FIG. 13b, a portion of back surface 308 of semiconductor wafer 300 is removed by a grinding operation with grinder 317 to planarize the surface and reduce a thickness of the semiconductor wafer. The thickness T9 of semiconductor wafer 300 after grinding is 10-50 µm. A chemical etch, CMP, or plasma dry etch can also be used to remove back grinding damage and residue stress on semiconductor die 304 to enhance the package strength.

FIG. 13c shows another embodiment of removing a portion of back surface 308 of semiconductor wafer 300 by laser direct ablation (LDA) using laser 318 to reduce the thickness of the semiconductor wafer. In yet another example, hydrogen ions can be implanted in back surface 308 and then heated to allow one or more sheets of base material 122 to be peeled off to achieve the desired thickness T8.

After the thinning operation, the reduced thickness T9 achieves an elastic modulus that provides a flexible property for semiconductor wafer 300 and semiconductor die 304, i.e., the semiconductor wafer can bend to a concave orientation with respect to active surface 310, as shown in FIG. 13d, or bend to a convex orientation with respect to the active surface, as shown in FIG. 13e.

In FIG. 13f, semiconductor wafer 300 is singulated through saw street 306 using a saw blade or laser cutting tool 319 into individual semiconductor die 304. Semiconductor die 304 retains the flexible property, as shown in FIGS. 13d-13e, given to semiconductor wafer 300 by the wafer thinning operation.

Figure 14A:
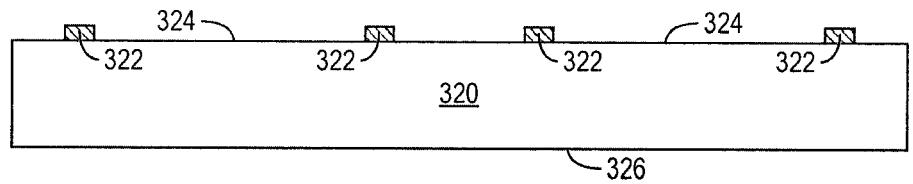
FIGS. 14a-14i illustrate a process of forming a flexible substrate and mounting the flexible semiconductor die to the flexible substrate with flexible stud bumps.

FIGS. 14a-14i illustrate a process of forming a flexible substrate and mounting the flexible semiconductor die to the flexible substrate with flexible stud bumps. FIG. 14a shows a substrate 320 containing a base material, such as silicon, polymer, beryllium oxide, or other suitable material for structural support. An electrically conductive layer 322 is formed over a first surface 324 using electrolytic plating, electroless plating process, or other suitable metal deposition process. Substrate 320 has a second surface 326 opposite first surface 324. Conductive layer 322 can be one or more layers of Al, Cu, Sn, Ni, Au, Ag, or other suitable electrically conductive material. Conductive layer 322 operates as bond pads formed at locations on substrate 320.

Figure 14B:
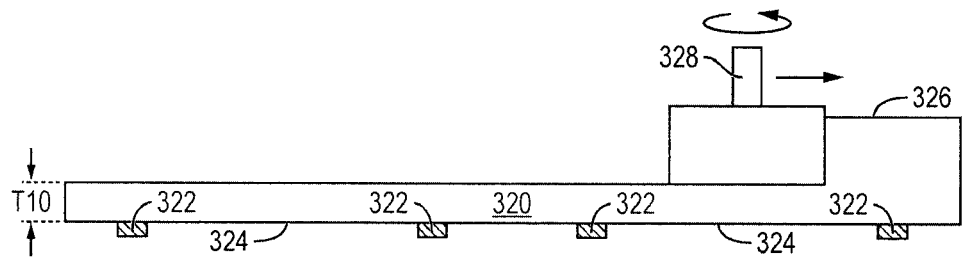

In FIG. 14b, a portion of surface 326 of substrate 320 is removed by a grinding operation with grinder 328 to planarize the surface and reduce a thickness of the substrate. The thickness T10 of substrate 320 after grinding is less than 50 μm. A chemical etch, CMP, or plasma dry etch can also be used to remove back grinding damage.

Figure 14C:
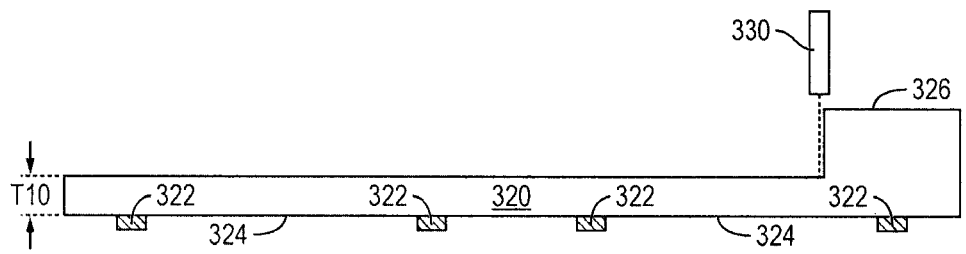

FIG. 14c shows another embodiment of removing a portion of surface 326 of substrate 320 by LDA using laser 330 to reduce the thickness of the substrate. In yet another example, hydrogen ions can be implanted in surface 326 and then heated to allow one or more sheets of base material to be peeled off to achieve the desired thickness T10.

Figure 14D:
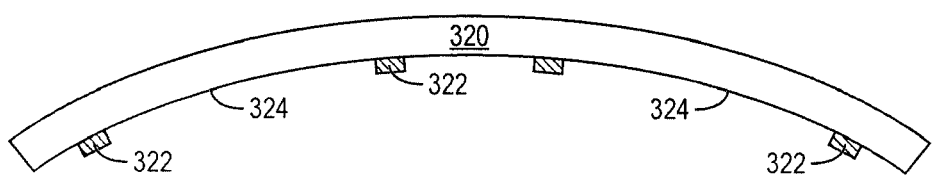
Figure 14E:
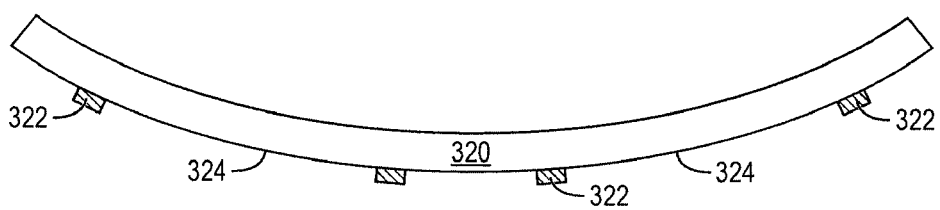

After the thinning operation, the reduced thickness T10 achieves an elastic modulus that provides a flexible property for substrate 320, i.e., the substrate can bend to a concave orientation with respect to surface 324, as shown in FIG. 14d, or bend to a convex orientation with respect to surface 324, as shown in FIG. 14e.

In another embodiment, substrate 320 can be made with polyimide, polyetheretherketone (PEEK) polymer film, polyethylene terephtalate (PET), or transparent conductive polyester capable of bending to conform to the physical layout of an electronic product.

Figure 14F:
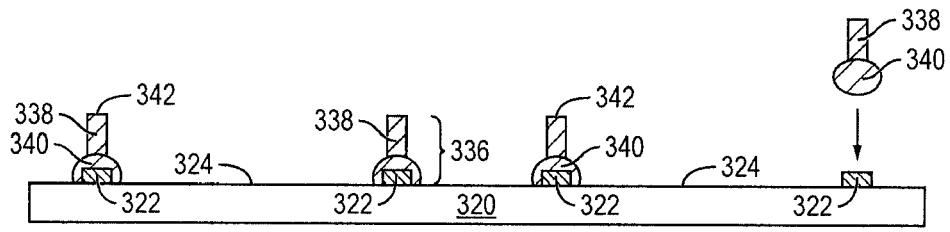

In FIG. 14f, a plurality of non-fusible stud bumps or stud pedestals 336 is formed over conductive layer 322 as a vertical interconnect structure. Stud bumps 336 include fusible base 340 with non-fusible stem or post 338. Base 340 can be Sn, eutectic Sn/Pb, lead-free solder, binary alloys such as Sn—Pb, Sn—Bi, Sn—Cu, Sn—Ag, and Sn—Sb, ternary alloys such as Sn—Ag—Cu, and other suitable fusible material. Post 338 can be Au, Cu, alloys of Au or Cu, or other non-fusible conductive material. The width of base 340 is greater than a width of conductive layer 322. Base 340 is positioned over conductive layer 322 and reflowed to cover the top and side surfaces of conductive layer 322 as a BOT connection. Posts 338 have a sufficient length to exhibit a flexible property. Stud bumps 336 provide a non-fusible, flexible, and reliable vertical interconnect structure.

Figure 14G:
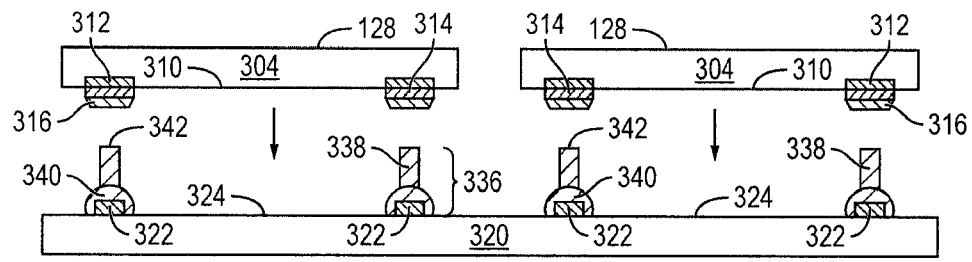

After singulation of semiconductor wafer 300 in FIG. 13f, semiconductor die 304 is positioned over substrate 320 using a pick and place operation with active surface 310 oriented toward the substrate and fusible layer 316 aligned with stud bumps 336. In FIG. 14g, semiconductor die 304 is brought into proximity of substrate 320 with fusible layer 316 contacting stud bumps 336. Fusible layer 316 is reflowed to metallurgically and electrically connect the fusible layer with the respective stud bumps 336.

Figure 14H:
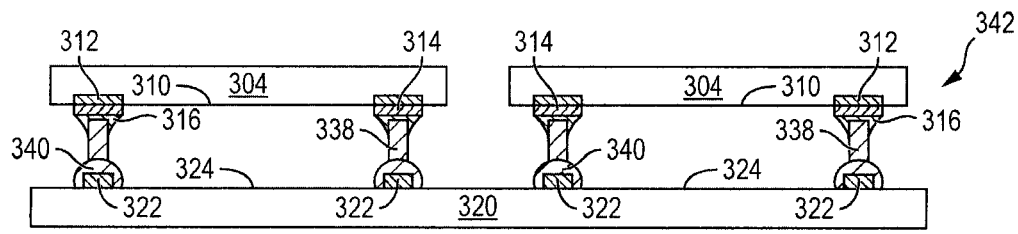

Alternatively, stub bumps 336 is metallurgically and electrically connected to the respective conductive layer 322 by thermal compression bonding, e.g., 30 MPa of pressure at 300° C. for 2 minutes. FIG. 14h shows semiconductor die 304 mounted to substrate 320 with fusible layer 316 bonded to respective stud bumps 336. Fusible layer 316 coalesces around posts 338.

A portion of stud bumps 336 can be removed by an etching process to reduce a diameter or width of the stub bumps. The reduced width of stud bumps 336, as well as the high ratio of height to cross section, provides an elastic or flexible property for the stud bumps. Given the flexible property of semiconductor die 304 and substrate 320, the flexible property of stud bumps 336 allow bending of the bonded semiconductor die and substrate without breaking or damaging the interconnect.

Figure 14I:
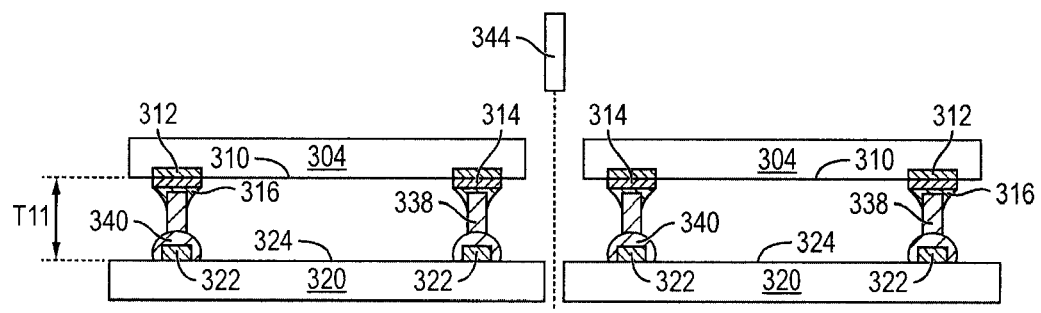

In FIG. 14i, reconstituted wafer 342 is singulated through substrate 320 using saw blade or laser cutting tool 344.

Figure 15:
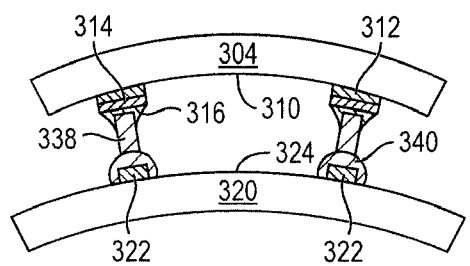
FIG. 15 illustrates the flexible semiconductor die mounted to the flexible substrate with flexible stud bumps.

FIG. 15 shows the bonded semiconductor die 304 and substrate 320 bending while maintaining the interconnect integrity of flexible stud bump 336.

Figure 16:
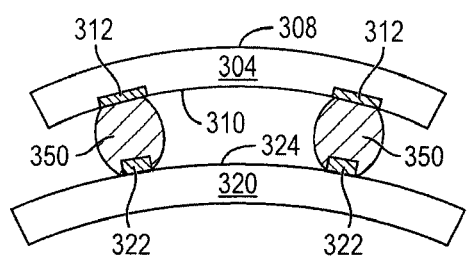
FIG. 16 illustrates the flexible semiconductor die mounted to the flexible substrate with flexible polymer bumps.

In another embodiment, polymer bumps 350 are formed between semiconductor die 304 and substrate 320, as shown in FIG. 16. Polymer bumps 350 include a silicone or other polymer material with metal powder, such as Ag. Polymer bumps 350 have a flexible property to allow bending of the combined semiconductor die and substrate without breaking or damaging the interconnect.

The vertical interconnect structure between semiconductor die 304 and substrate 320, including conductive layers 312 and 322, fusible layer 316, and stud bumps 336, provide a fine pitch, e.g., 70 μm or less, for a high I/O count application. The vertical interconnect structure can be formed on active surface 310, or in a peripheral region around semiconductor die 304. The flexible property of stud bumps 336, by nature of the high ratio of height to cross section, allow bending of the bonded flexible semiconductor die and flexible substrate without breaking or damaging the interconnect.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
   providing a semiconductor die;
   providing a substrate;
   forming a vertical interconnect structure including a linear sidewall extending from the semiconductor die to the substrate; and
   mounting the semiconductor die to the substrate including a fixed offset between the semiconductor die and substrate, wherein a first width of the vertical interconnect structure in a cross-section taken perpendicular to the linear sidewall is greater than a second width of the vertical interconnect structure in the cross-section of the first width of the vertical interconnect structure prior to mounting the semiconductor die to the substrate.

2. The method of claim 1, wherein the vertical interconnect structure includes a stud bump or conductive column.

3. The method of claim 1, wherein the vertical interconnect structure includes copper.

4. The method of claim 1, wherein the vertical interconnect structure includes a tapered sidewall.

5. The method of claim 1, wherein a width of the vertical interconnect structure is greater than a mating conductive trace formed on the semiconductor die or substrate.

6. The method of claim 1, wherein the vertical interconnect structure includes an oval cross sectional area.

7. The method of claim 1, wherein the semiconductor die includes a flexible property, the vertical interconnect structure includes a flexible property, and the substrate includes a flexible property.

* * * * *